United States Patent
Sukekawa

(10) Patent No.: US 10,535,710 B2
(45) Date of Patent: Jan. 14, 2020

(54) METHODS OF FORMING INTEGRATED CIRCUITRY

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/421,242

(22) Filed: May 23, 2019

(65) Prior Publication Data

US 2019/0288034 A1    Sep. 19, 2019

Related U.S. Application Data

(63) Continuation of application No. 15/923,864, filed on Mar. 16, 2018.

(51) Int. Cl.
*H01L 21/332* (2006.01)
*H01L 29/74* (2006.01)
(Continued)

(52) U.S. Cl.
CPC .......... *H01L 27/228* (2013.01); *G11C 11/161* (2013.01); *G11C 11/1657* (2013.01); *H01F 10/329* (2013.01); *H01F 10/3254* (2013.01); *H01L 21/02164* (2013.01); *H01L 21/30604* (2013.01); *H01L 21/30625* (2013.01);
(Continued)

(58) Field of Classification Search
CPC ............ H01L 21/8222; H01L 21/8229; H01L 21/823487; H01L 27/1027; H01L 27/1062; H01L 29/66666; H01L 29/7827; H01L 29/4236; H01L 29/0673; H01L 21/76877; H01L 21/76898; H01L 21/76831; H01L 21/76802; H01L 21/76224; H01L 21/76897; H01F 10/329; G11C 11/161; G11C 11/1657
See application file for complete search history.

(56) References Cited

U.S. PATENT DOCUMENTS 10,103,053 B1    10/2018    Sukekawa
2002/0089024 A1    7/2002    Iwata
(Continued)

*Primary Examiner* — Caridad Everhart
(74) *Attorney, Agent, or Firm* — Wells St. John P.S.

(57) ABSTRACT

Some embodiments include a method of forming integrated circuitry. A structure has first conductive lines over a dielectric bonding region, has semiconductor material pillars extending upwardly from the first conductive lines, and has second conductive lines over the first conductive lines and extending along sidewalls of the semiconductor material pillars. The first conductive lines extend along a first direction, and the second conductive lines extend along a second direction which intersects the first direction. The structure includes semiconductor material under the dielectric bonding region. Memory structures are formed over the semiconductor material pillars. The memory structures are within a memory array. Third conductive lines are formed over the memory structures. The third conductive lines extend along the first direction. Individual memory structures of the memory array are uniquely addressed through combinations of the first, second and third conductive lines.

10 Claims, 29 Drawing Sheets

(51) Int. Cl.
*H01L 27/22* (2006.01)
*G11C 11/16* (2006.01)
*H01L 29/10* (2006.01)
*H01L 43/02* (2006.01)
*H01L 29/78* (2006.01)
*H01L 43/08* (2006.01)
*H01F 10/32* (2006.01)
*H01L 21/306* (2006.01)
*H01L 21/762* (2006.01)
*H01L 21/02* (2006.01)
*H01L 21/768* (2006.01)
*H01L 29/66* (2006.01)
*H01L 29/08* (2006.01)
*H01L 23/528* (2006.01)
*H01L 43/12* (2006.01)
*H01L 21/311* (2006.01)

(52) U.S. Cl.
CPC .. *H01L 21/76224* (2013.01); *H01L 21/76802* (2013.01); *H01L 21/76831* (2013.01); *H01L 21/76877* (2013.01); *H01L 21/76895* (2013.01); *H01L 23/528* (2013.01); *H01L 29/0847* (2013.01); *H01L 29/1037* (2013.01); *H01L 29/66666* (2013.01); *H01L 29/7827* (2013.01); *H01L 43/02* (2013.01); *H01L 43/08* (2013.01); *H01L 43/12* (2013.01); *H01L 21/02282* (2013.01); *H01L 21/31111* (2013.01)

(56) References Cited

U.S. PATENT DOCUMENTS

| | | |
|---|---|---|
| 2010/0207195 A1 | 8/2010 | Fukuzumi et al. |
| 2011/0198691 A1 | 8/2011 | Sonsky et al. |
| 2011/0316042 A1 | 12/2011 | Tang et al. |
| 2012/0080725 A1* | 4/2012 | Manos ................ H01L 27/101 257/208 |
| 2014/0321195 A1* | 10/2014 | Antonyan .......... G11C 13/0021 365/148 |
| 2017/0309497 A1 | 10/2017 | Dieny et al. |

* cited by examiner

US 10,535,710 B2

METHODS OF FORMING INTEGRATED CIRCUITRY

RELATED PATENT DATA

This patent resulted from a continuation of U.S. patent application Ser. No. 15/923,864 which was filed Mar. 16, 2018 and which is hereby incorporated by reference herein.

TECHNICAL FIELD

Methods of forming integrated circuitry; such as, for example, methods of forming memory architectures having monocrystalline semiconductor material within channel regions of access devices.

BACKGROUND

Transistors may be utilized in numerous applications; such as, for example, dynamic random-access memory (DRAM), resistive RAM (RRAM), magnetic RAM (MRAM), spin-transfer-torque-MRAM (STT-MRAM), etc.

A field-effect transistor (FET) comprises a gated channel region between a pair of source/drain regions.

A continuing goal of semiconductor fabrication is to increase the density of integration. It is therefore desired to develop improved FET architectures which are suitable for utilization in highly-integrated architectures, and to develop methods for fabricating such FET architectures.

Wafer bonding is a methodology which may have application relative to integrated assemblies. Wafer bonding comprises the bonding of two semiconductor assemblies to one another to form a composite structure. One method of wafer bonding comprises formation of silicon dioxide surfaces across each of the assemblies which are to be bonded to one another. The silicon dioxide surfaces are then placed against one another, and subjected to appropriate treatment to induce covalent bonding between the surfaces and thereby form the composite structure. The treatment utilized to induce the covalent bonding may be a thermal treatment. In some applications, such thermal treatment may utilize a temperature in excess of 800° C. Alternatively, one or both of the silicon dioxide surfaces may be subjected to a plasma treatment prior to the thermal treatment, and in such aspects the temperature of the thermal treatment may be reduced to a temperature within a range of from about 150° C. to about 200° C. The bonding of the silicon dioxide surfaces to one another may be referred to as "fusion bonding".

DETAILED DESCRIPTION OF THE ILLUSTRATED EMBODIMENTS

Vertical transistors are transistors in which a channel region extends vertically between source/drain regions. Vertical transistors may be utilized as access devices in highly-integrated memory architectures. It may be simpler to incorporate polysilicon into channel regions of vertical transistors than to incorporate single crystal silicon (i.e., monocrystalline silicon) in the channel regions. However, polysilicon can cause malfunctions in memory performance due to, for example, deviations in transistor resistance with increasing miniaturization. Some embodiments include recognition that it would be advantageous to incorporate monocrystalline silicon into channel regions of vertical access transistors. Some embodiments include new methods in which wafer bonding (i.e., fusion bonding) techniques are utilized to enable vertical access transistors to be formed with monocrystalline silicon across active regions of the transistors (i.e., across the channel regions and source/drain regions of the transistors). Although monocrystalline silicon is recognized as a desirable material for active regions of vertical transistors, it is also recognized that other semiconductor materials may be suitable in some applications. Accordingly, it is to be understood that embodiments described herein may to be suitable for utilization with monocrystalline silicon and/or with other semiconductor materials. Example embodiments are described with reference to FIGS. 1-29.

Figure 1:
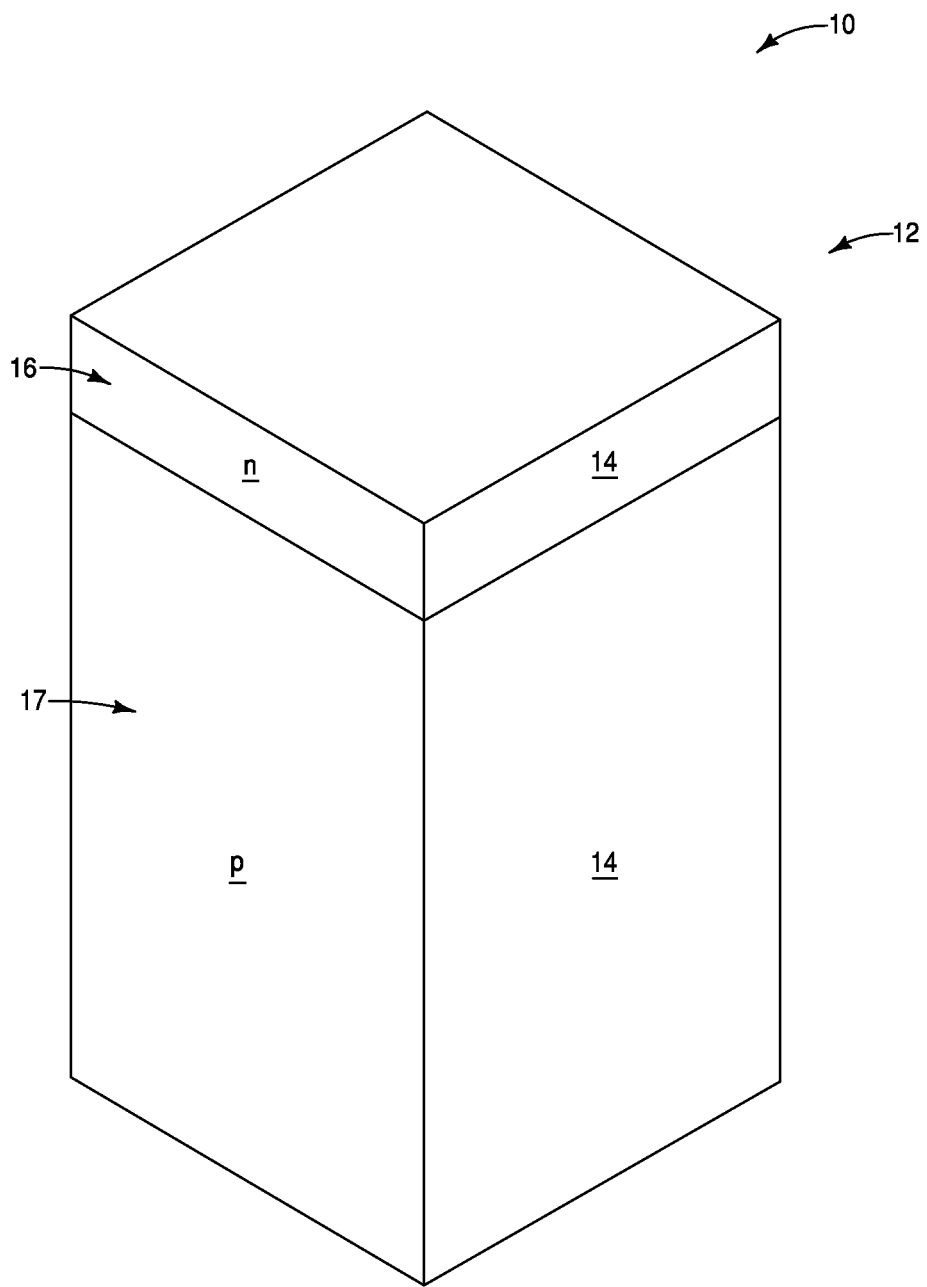
FIGS. 1-10 are diagrammatic three-dimensional views of an example integrated arrangement at example process stages of an example method for fabricating integrated circuitry.

Referring to FIG. 1, a construction 10 includes a mass 12 of semiconductor material 14. The semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of single crystal silicon (i.e. monocrystalline silicon). In some embodiments, the semiconductor material 14 may be referred to as a first semiconductor material to distinguish it from other semiconductor materials formed at later process stages.

The mass 12 includes a first conductively-doped region 16 over a second conductively-doped region 17. One of the regions 16 and 17 is n-type doped while the other is p-type doped. In the shown embodiment, the upper region 16 is n-type doped, while the lower region 17 is p-type doped. In other embodiments, the doping of regions 16 and 17 may be reversed so that the lower region 17 is n-type doped and the upper region 16 is p-type doped. Although the doped regions 16 and 17 are shown to be provided at the process stage of FIG. 1, in other embodiments one or both of such doped regions may be provided at a later process stage.

In some embodiments, the mass 12 may be considered to be an example of a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Figure 2:
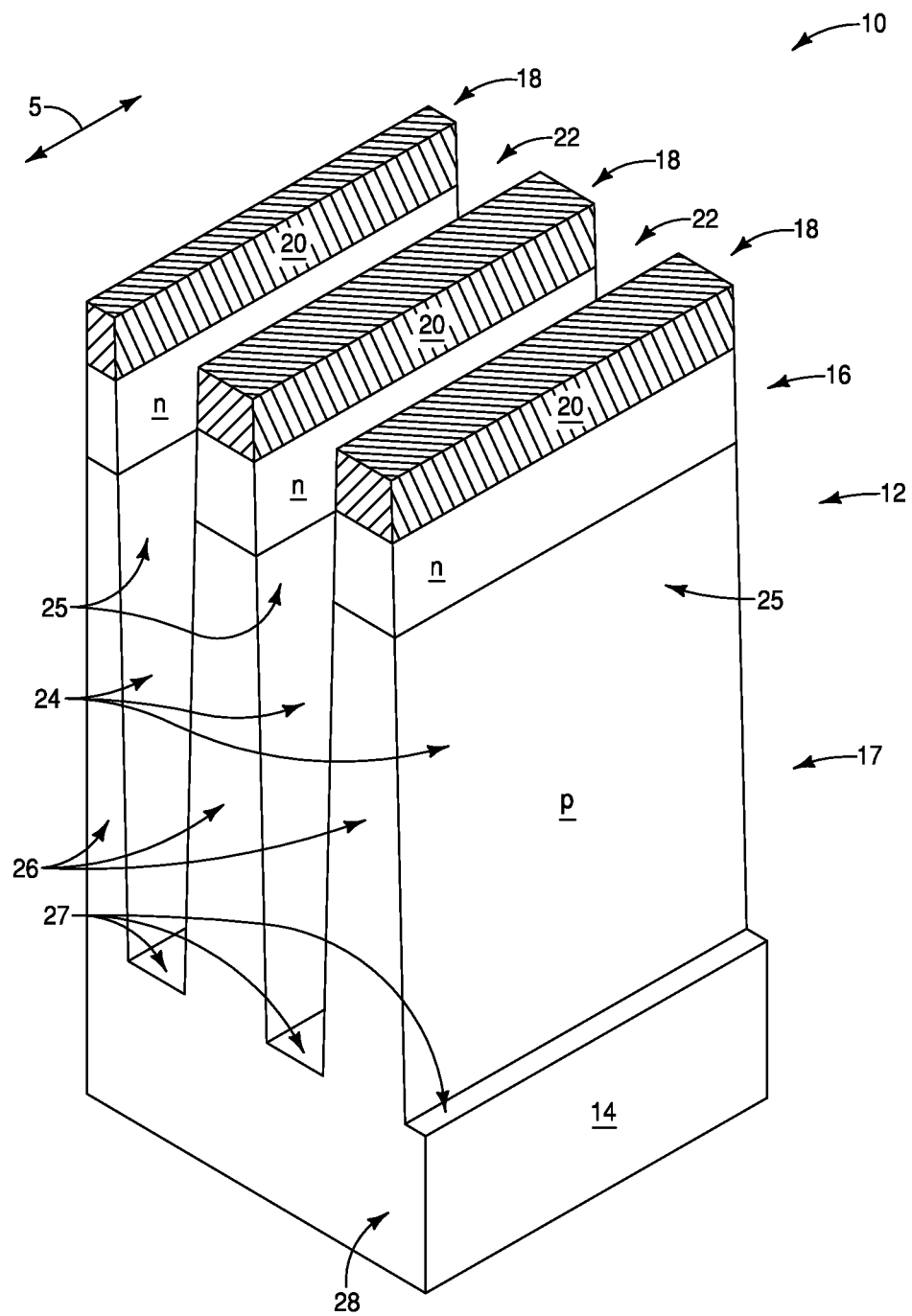

Referring to FIG. 2, conductive lines 18 are formed over the semiconductor material 14. The conductive lines 18 comprise conductive material 20. The conductive material 20 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 20 may comprise tungsten, either alone or in combination with one or more suitable conductive barrier materials (e.g., oxidation-resistant materials which protect the tungsten from oxidation in embodiments in which the tungsten may be exposed to oxygen).

The conductive lines 18 may be formed to any suitable thickness, and in some embodiments may be formed to a thickness of at least about 20 nanometers (nm). The conductive lines may be formed to any suitable pitch; and in some embodiments may be formed to a pitch within a range of from about 20 nm to about 100 nm (e.g., a pitch about 40 nm).

The conductive lines may be formed with any suitable processing. For instance, a film of conductive material 20 may be formed over an upper surface of the mass 12, a patterned mask (not shown) may be formed over the film to define locations of the lines 18, and a pattern may be transferred from the mask into the film to form the lines 18. The mask may be removed to leave the conductive lines 18, or in some embodiments at least a portion of the mask may remain as part of the assembly 10 at the process stage of FIG. 2.

The conductive lines 18 are spaced from one another by gaps 22. Such gaps are extended into the mass 12 of the semiconductor material 14 to form trenches 24. The trenches 24 may be formed to any suitable depth; such as, for example, a depth within a range of from about 150 nm to about 300 nm (e.g., a depth of about 180 nm).

The trenches 24 extend along a first direction represented by an axis 5. The trenches 24 may be referred to as first trenches to distinguish them from other trenches formed at subsequent process stages.

The trenches 24 have sidewalls 25 and have bottom peripheries 27. In some embodiments, the trenches 24 may be considered to form semiconductor material walls 26 from the semiconductor material 14, and the sidewalls 25 may be considered to be along surfaces of such semiconductor material walls.

The bottom peripheries 27 of the trenches 24 are over a remaining base 28 of the semiconductor material 14.

Figure 3:
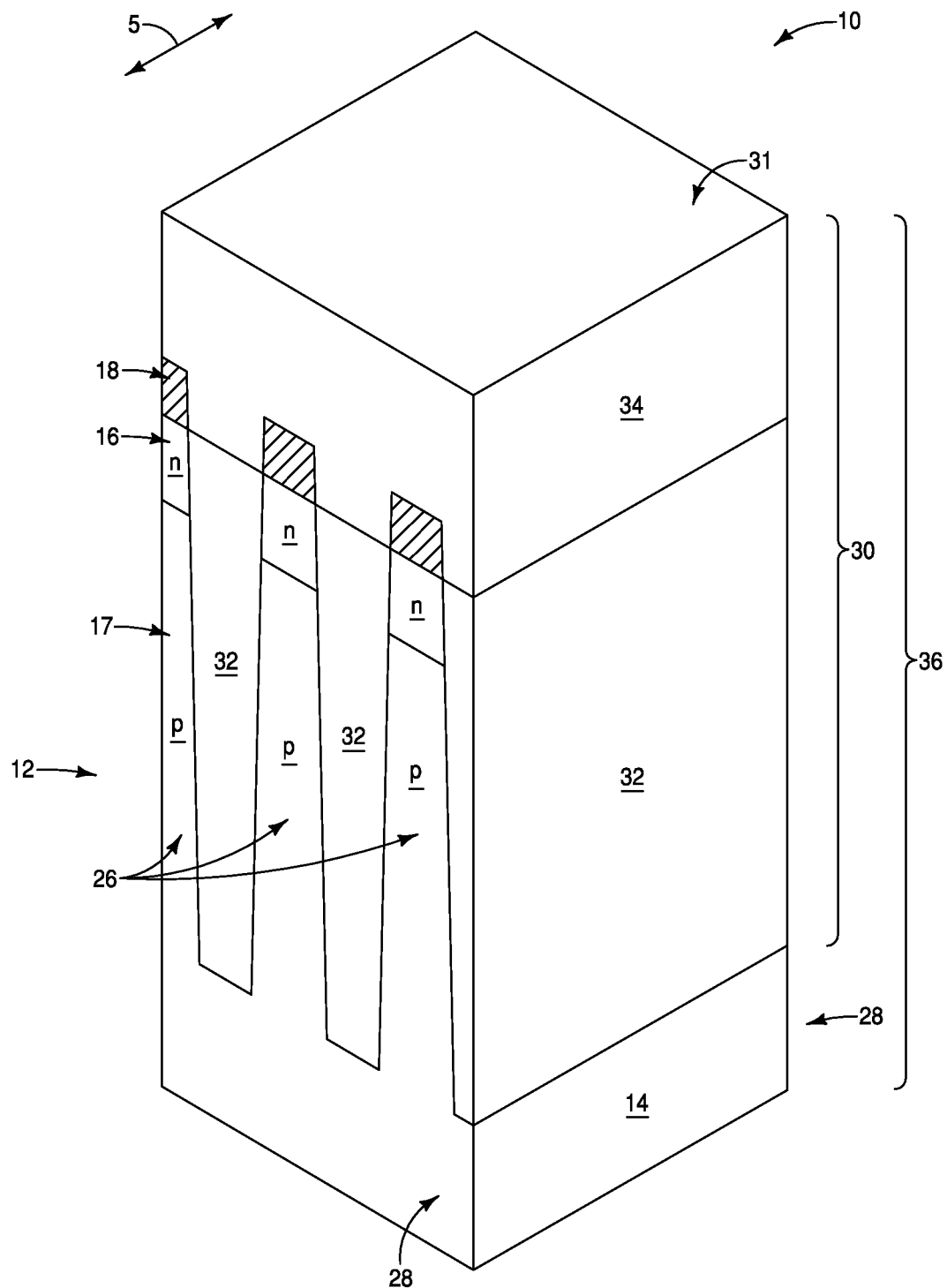

Referring to FIG. 3, an insulative mass 30 is formed to fill the trenches 24 and to cover the conductive lines 18. The insulative mass 30 is shown to comprise two insulative compositions 32 and 34, with the lower insulative composition 32 filling the trenches 24, and the upper insulative composition 34 being over the lower insulative composition 32. In some embodiments, the insulative compositions 32 and 34 may both comprise a same composition as one another; and may, for example, both comprise, consist essentially of, or consist of silicon dioxide. In other embodiments, the insulative compositions 32 and 34 may comprise different compositions relative to one another. In some embodiments, the insulative compositions 32 and 34 may both comprise silicon dioxide, but one of the compositions may have a different density than the other of the compositions.

In some embodiments, the insulative composition 34 may be considered to be a dielectric bonding material. The dielectric bonding material 34 has an upper surface 31. The upper surface 31 may be a planarized surface formed utilizing a suitable polishing process; such as, for example, chemical-mechanical polishing (CMP). The dielectric bonding material 34 may be referred to as a first dielectric bonding material to distinguish it from other dielectric bonding materials formed at later process stages.

In some embodiments, the semiconductor material 14, conductive lines 18, and insulative mass 30 may be considered together to form a first assembly 36.

Figure 4:
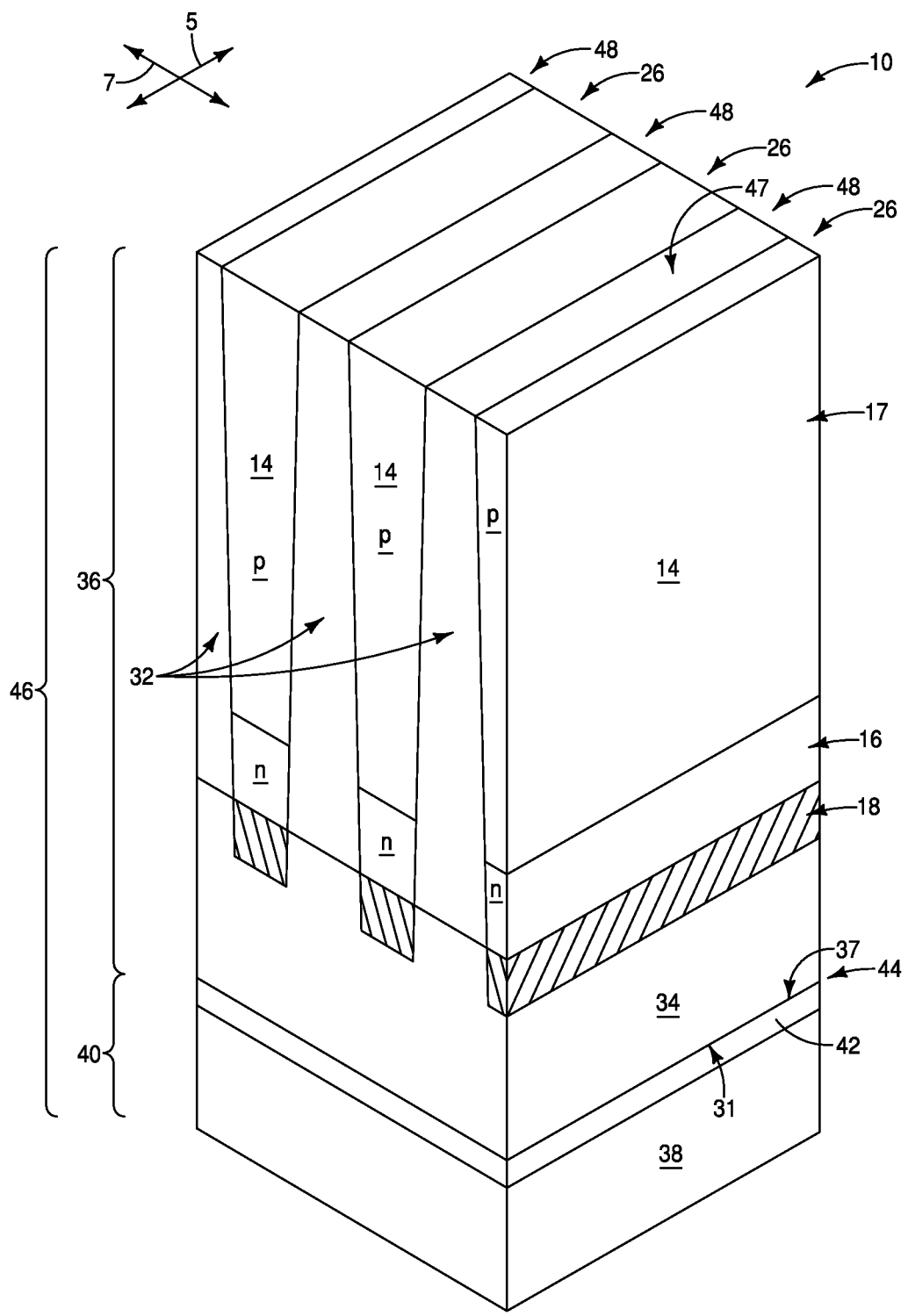

Referring to FIG. 4, the first assembly 36 is inverted and bonded to a second assembly 40. The second assembly 40 includes a dielectric bonding material 42 over a semiconductor material 38. In some embodiments, the dielectric bonding material 42 may be referred to as a second dielectric bonding material to distinguish it from the first dielectric bonding material 34.

In some embodiments, the semiconductor material 38 may be referred to as a second semiconductor material to distinguish it from the first semiconductor material 14. The second semiconductor material 38 may comprise any of the semiconductor compositions described above relative to the first semiconductor material 14. The second semiconductor material 38 may comprise a same composition as the first semiconductor material 14, or may comprise a different composition relative to the first semiconductor material 14. In some embodiments, the first and second semiconductor materials 14 and 38 may both comprise, consist essentially of, or consist of monocrystalline silicon.

The second dielectric bonding material 42 has an upper surface 37. The surface 31 of the first dielectric bonding material 34 is bonded to the surface 37 of the second dielectric bonding material 42 to form a dielectric bonding region 44. The bonded assemblies 36 and 40 may be considered together to form a third assembly 46.

An upper surface of the third assembly 46 would initially comprise the base 28 (shown as the bottom of the first assembly 36 at the processing stage of FIG. 3), but such base is removed with an appropriate polishing process (e.g., CMP) to form the planarized upper surface 47 of the third assembly 46 at the processing stage of FIG. 4.

The insulative material 32 within trenches 24 (with the trenches 24 being labeled in FIG. 2) forms insulative walls 48 at the processing stage of FIG. 4. Such insulative walls alternate with the semiconductor material walls 26. The planarized surface 47 extends across the insulative walls 48 and the semiconductor material walls 26.

The construction 10 of FIG. 4 may be considered to be an integrated arrangement which includes all of the materials and structures of the third assembly 46.

The semiconductor material walls 26 and insulative walls 48 extend along the first direction of axis 5, and alternate with one another along a second direction represented by an axis 7.

Figure 5:
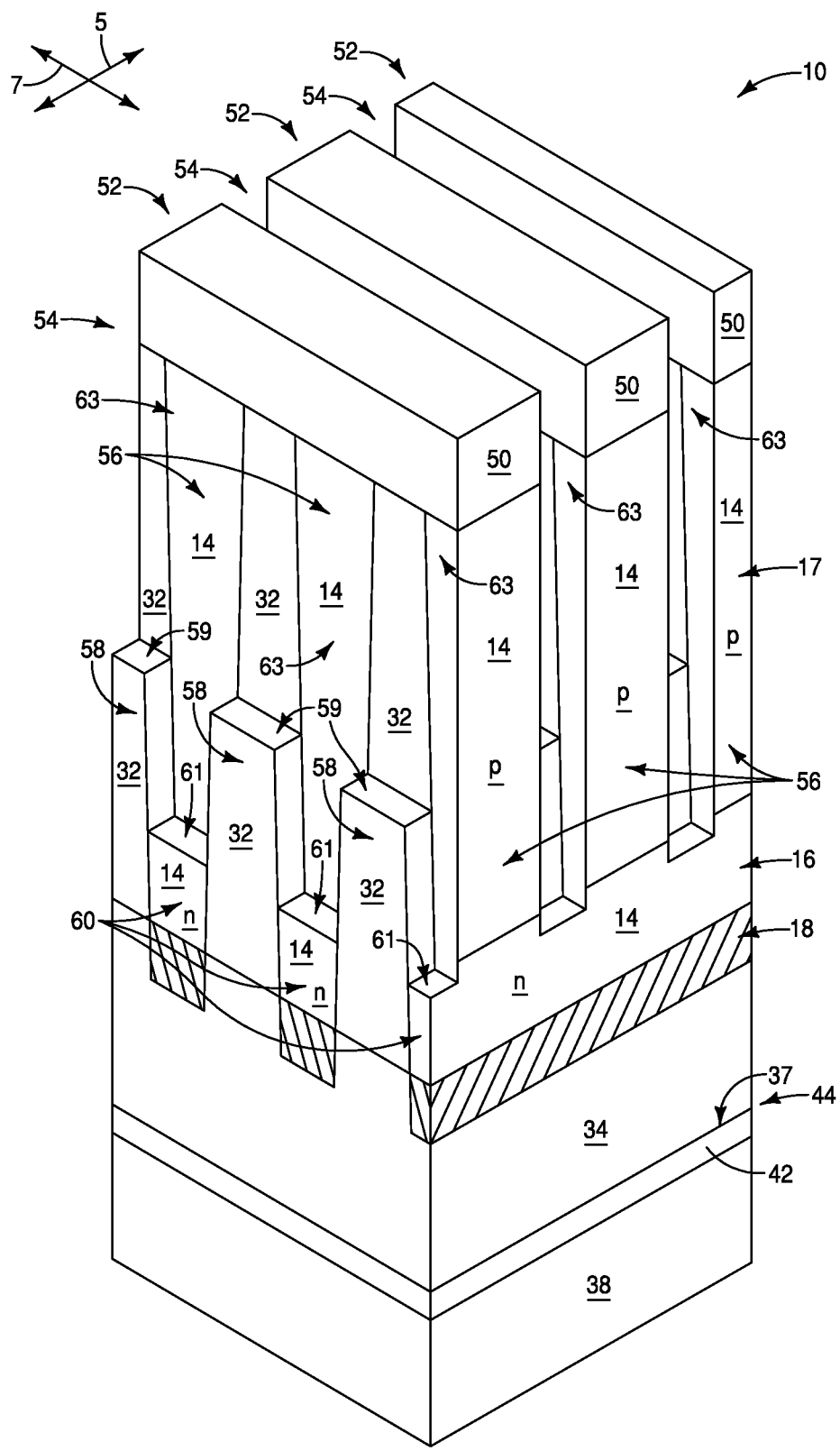

Referring to FIG. 5, masking material 50 is formed over the planarized upper surface 47 (labeled in FIG. 4), and patterned into a plurality of lines 52. The lines 52 extend along the second direction of axis 7. The second direction of axis 7 intersects the first direction of axis 5. In the illustrated embodiment, the second direction of axis 7 is substantially orthogonal to the first direction of axis 5; with the term "substantially orthogonal" meaning orthogonal to within reasonable tolerances of fabrication and measurement.

The masking material 50 may comprise any suitable composition or combination of compositions; and in some embodiments may comprise, consist essentially of, or consist of silicon nitride. The masking material 50 may be patterned into the illustrated lines 52 utilizing any suitable methodology. For instance, in some embodiments a lithographically-patterned mask (not shown) may be utilized to define locations of the lines 52, and a pattern may be transferred from such mask to the masking material 50 utilizing one or more suitable etches. The mask may be removed to leave the configuration shown in FIG. 5, or in other embodiments may remain at the process stage of FIG. 5.

The lines 52 are utilized to pattern trenches 54 which extend along the second direction of axis 7. The trenches 54 extend downwardly into the semiconductor walls 26 (the walls 26 are labeled in FIG. 4), and form semiconductor material pillars 56 from upper regions of the second material walls. Lower regions of the semiconductor material walls become rails 60; with such rails extending along the conductive lines 18, and extending along the first direction of axis 5.

The trenches 54 are formed with etching which removes the semiconductor material 14 faster than the insulative material 32. Accordingly, such etching leaves steps 58 of the insulative material 32 along bottom peripheries of the trenches 54. In the illustrated embodiment, the bottom peripheries of the trenches 54 have upper surfaces 59 over the insulative steps 58, and have lower surfaces 61 over the semiconductor material rails 60. Accordingly, the bottom peripheries of the trenches 54 have undulating topographies which include higher regions along top edges of the steps 58 (with the top edges of the steps corresponding to the surfaces 59), and which include lower regions along the top edges of the semiconductor material rails 60 (with the top edges of the rails corresponding to the surfaces 61). In the shown embodiment, the semiconductor material rails 60 only include n-type doped material of the n-type doped region 16.

The trenches may have any suitable dimensions; and in some embodiments may have depths within a range of from about 50 nm to about 150 nm (e.g., about 100 nm) over the steps 58; and may have depths within a range of from about 100 nm to about 200 nm (e.g., about 150 nm) over the upper surfaces 61 of the semiconductor material rails 60.

The semiconductor material pillars 56 have sidewall edges 63 exposed within the trenches 54, and the semiconductor material rails 60 have the top edges 61 exposed within such trenches.

Figure 6:
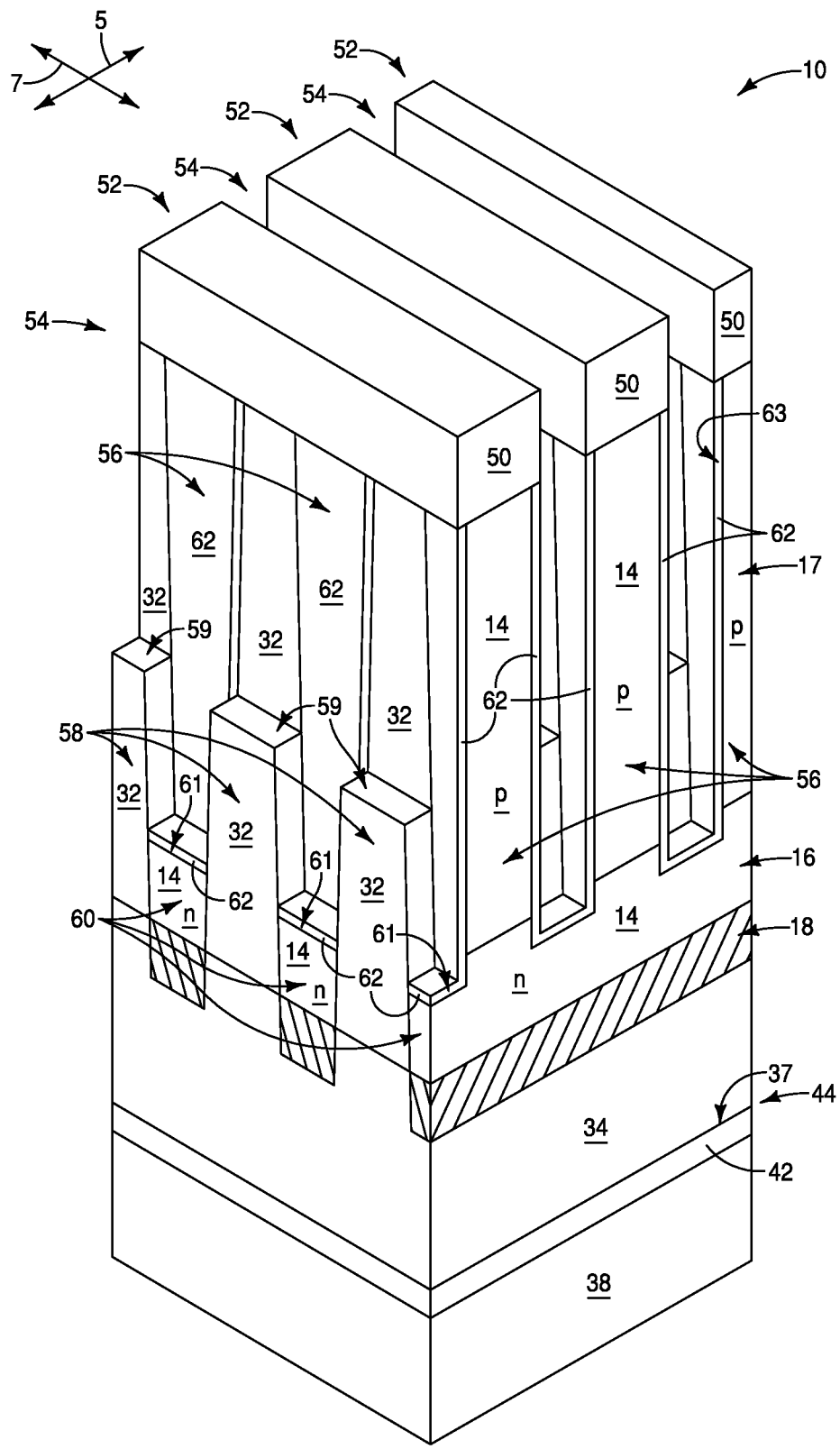

Referring to FIG. 6, dielectric material 62 is formed along the sidewall edges 63 of the semiconductor material pillars 56, and along the top edges 61 of the semiconductor material rails 60. The dielectric material 62 may comprise any suitable composition or combination of compositions; and in some embodiments may comprise, consist essentially of, or consist of silicon dioxide.

The dielectric material 62 may be formed with any suitable methodology. For instance, in embodiments in which the semiconductor material 14 comprises monocrystalline silicon, the dielectric material 62 may comprise silicon dioxide formed by oxidation of the monocrystalline silicon along exposed surfaces of the semiconductor material pillars 56 and the semiconductor material rails 60. Such oxidation may be accomplished with any suitable methodology; including, for example, lamp annealing.

The dielectric material 62 may have any suitable thickness; and in some embodiments may have a thickness within a range of from about 1 nm to about 6 nm (e.g., a thickness of about 4 nm).

In some embodiments, the dielectric material 62 may be referred to as gate dielectric.

Figure 7:
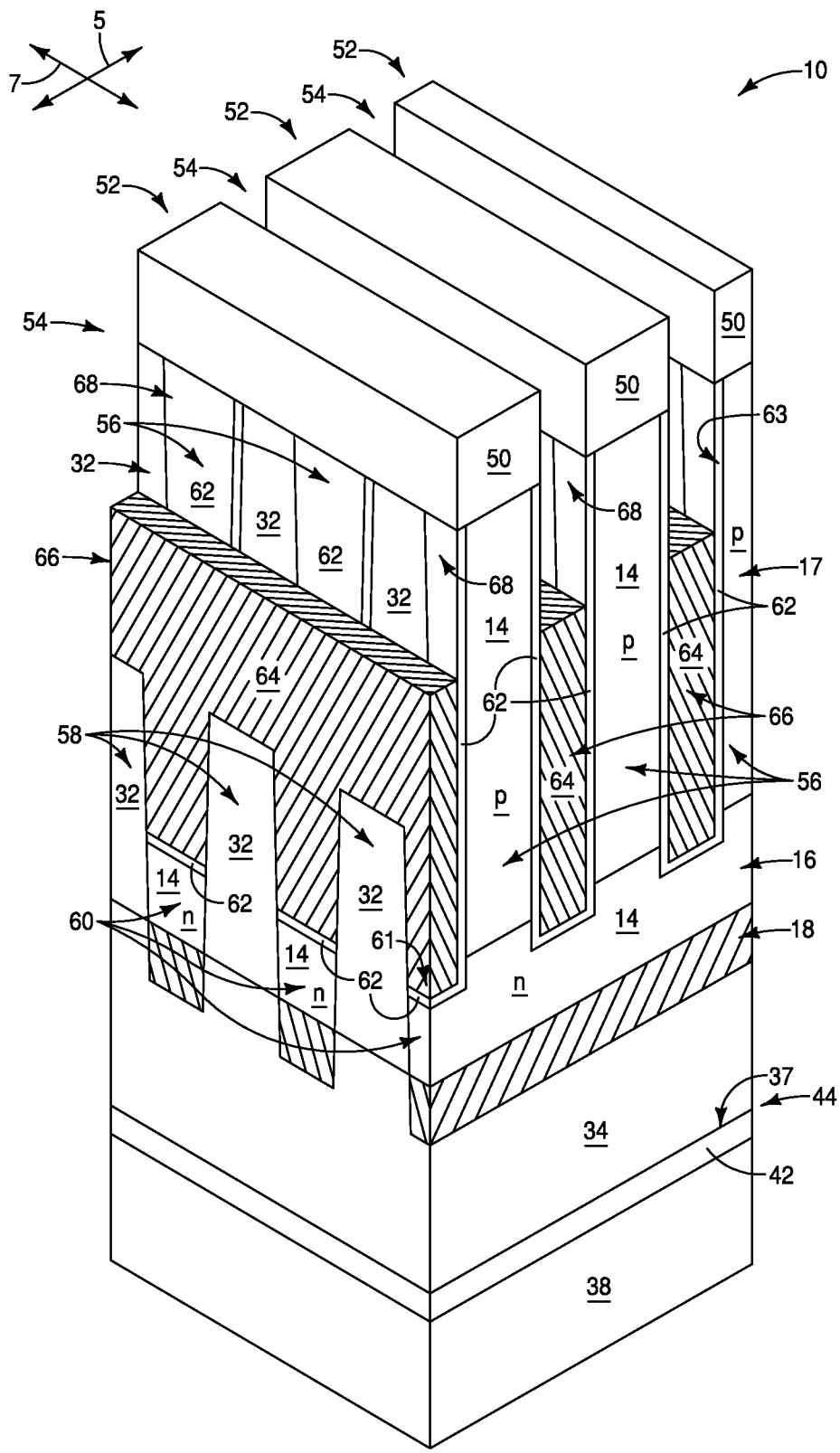

Referring to FIG. 7, conductive material 64 is formed within the trenches 54 and adjacent the dielectric material 62. The conductive material 64 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 64 may comprise, consist essentially of, or consist of titanium nitride.

The conductive material 64 is etched back within the trenches 54 to leave openings 68 over the conductive material 64. The openings 68 may have any suitable depths; and in some embodiments may have depths within a range of from about 30 nm to about 80 nm (e.g., about 50 nm).

The conductive material 64 forms conductive lines 66 within the trenches 54, and such conductive lines extend along the second direction of axis 7. The conductive lines 66 may be referred to as second conductive lines to distinguish them from the first conductive lines 18. In some embodiments, the second conductive lines 66 may correspond to wordlines.

Figure 8:
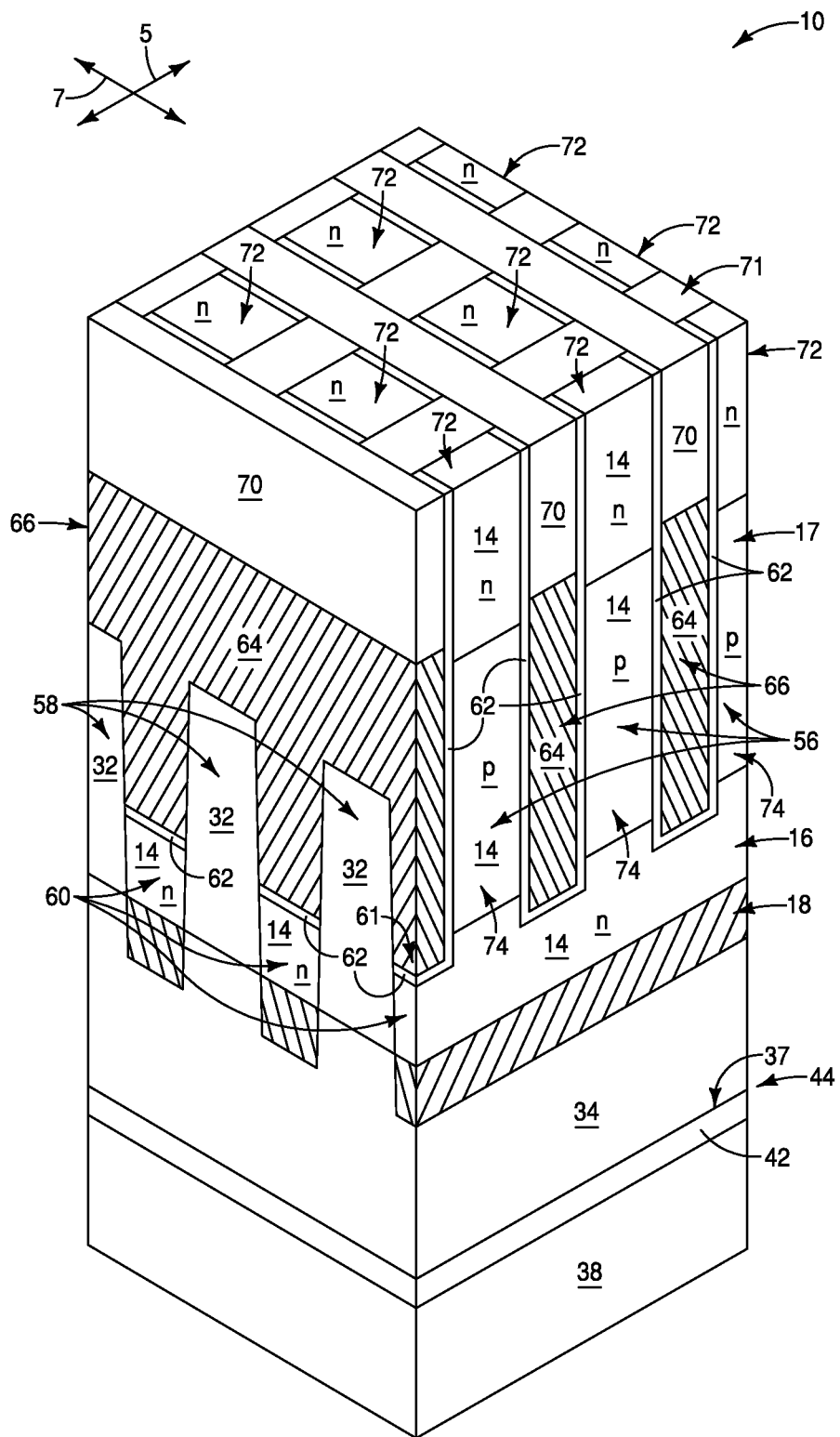

Referring to FIG. 8, insulative material 70 is formed within the openings 68 (labeled in FIG. 7); and then polishing (e.g., CMP) is utilized to remove material 50 (shown in FIG. 7) and form a planarized upper surface 71. Upper regions of the semiconductor material pillars 56 are exposed along the planarized upper surface 71. Such upper regions are doped to form n-type doped regions 72. The doping may be accomplished utilizing any suitable processing; including, for example, implanting of appropriate dopant into the semiconductor material 14 of the semiconductor material pillars 56.

The semiconductor material pillars 56 become active regions of vertical transistors 74. The n-type doped regions 16 and 72 correspond to source/drain regions of the vertical transistors 74, and the p-type doped regions 17 correspond to channel regions of such vertical transistors. The wordlines 66 comprise gates which gatedly couple the source/drain regions 16 and 72 to one another through the channel regions 17. Although the source/regions 16/72 are shown to be n-type doped, and the channel regions 17 to be p-type doped, in other embodiments the source/drain regions 16/72 may be p-type doped and the channel regions may be n-type doped.

The insulative material 70 may comprise any suitable composition(s); and in some embodiments may comprise, consist essentially of, or consist of silicon nitride.

Figure 9:
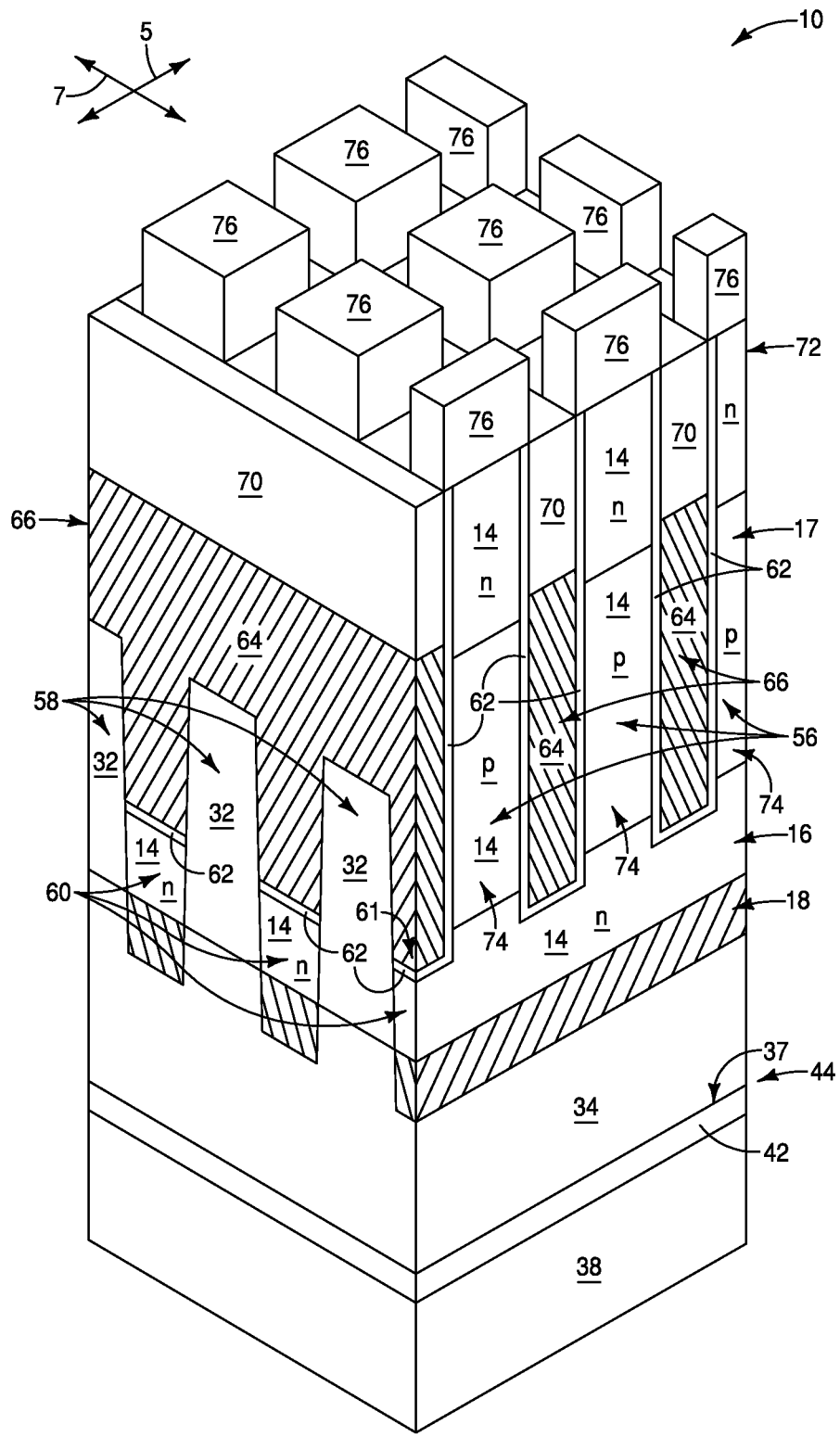

Referring to FIG. 9, memory structures 76 are formed over the semiconductor material pillars 56. Each of the memory structures 76 forms a memory cell. The memory structures 76 may be configured for utilization in resistive RAM cells, MRAM cells, STT-MRAM cells, etc. For instance, in some embodiments the memory structures 76 may comprise pinned magnetic layers, free magnetic layers, and tunnel barrier layers between the pinned and free magnetic layers; and accordingly may comprise magnetic tunnel junctions (MTJs) of the type utilized in MRAM cells, (for example, STT-MRAM cells).

Figure 10:
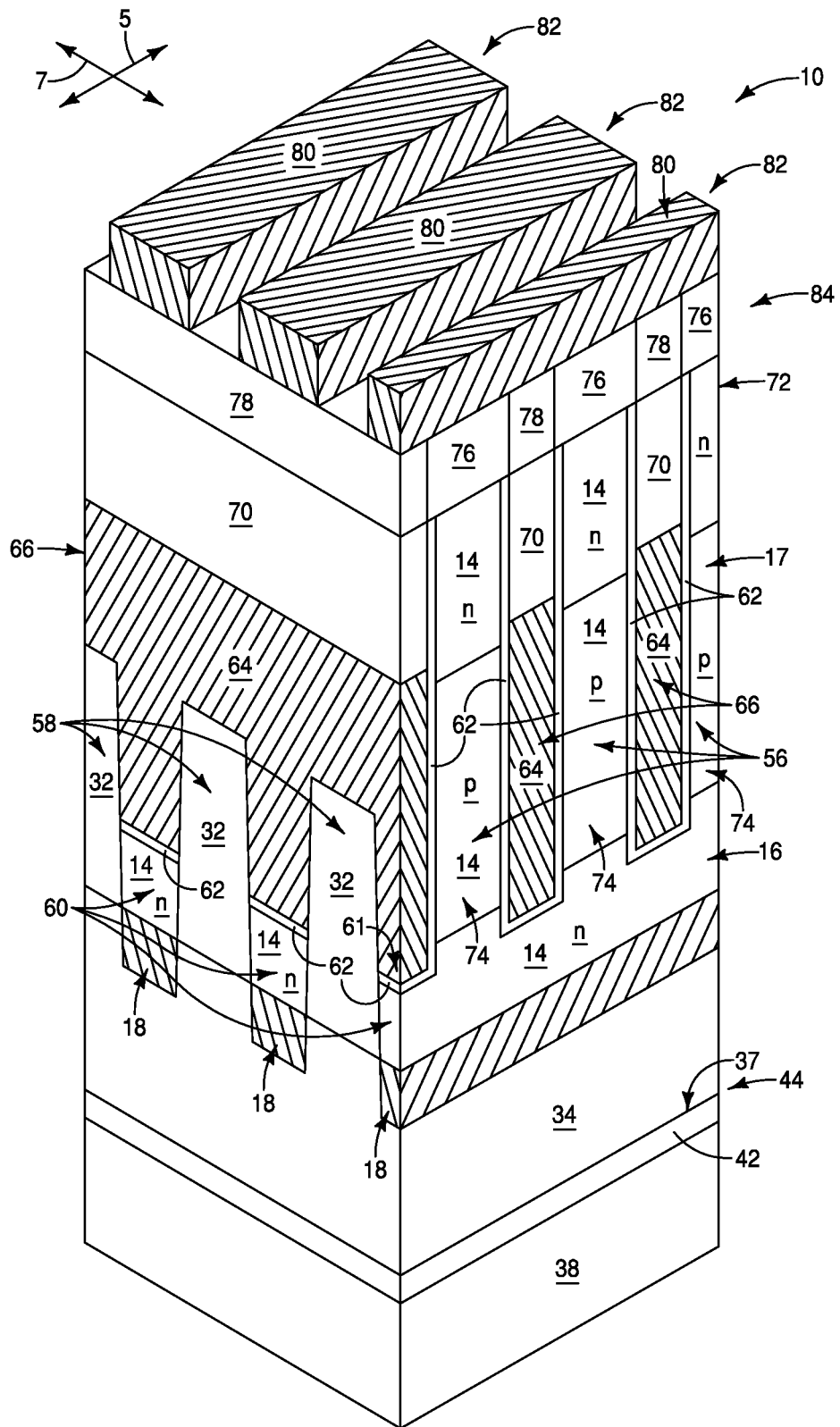

Referring to FIG. 10, insulative material 78 is formed between the memory structures 76. The insulative material 78 may comprise any suitable composition(s); and in some embodiments may comprise, consist essentially of, or consist of silicon nitride. The insulative material 78 may comprise a same composition as the underlying insulative material 70 in some embodiments, and in other embodiments may comprise a different composition relative to the insulative material 70.

Conductive material 80 is formed over the memory structures 76, and is patterned into conductive lines 82. The conductive material 80 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 80 may comprise, consist essentially of, or consist of tungsten. The conductive material 80 may be formed to any suitable thickness, and in some embodiments may be formed to a thickness within a range of from about 10 nm to about 50 nm (e.g., about 20 nm).

The conductive lines 82 extend along the first direction of the axis 5.

In some embodiments, the conductive lines 82 may be referred to as third conductive lines to distinguish them from the first conductive lines 18 and the second conductive lines 66.

In some embodiments, the memory structures 76 correspond to MRAM cells (e.g. STT-MRAM cells) of a memory array 84. The first conductive lines 18 are bitlines or source lines associated with such memory array; the third conductive lines 82 are the other of bitlines and source lines associated with the memory array; and the second conductive lines 66 are wordlines associated with the memory array. Each individual memory structure is uniquely addressed through a combination comprising one of the first conductive lines 18, one of the second conductive lines 66, and one of the third conductive lines 82. An example memory array is described in more detail below with reference to FIG. 15.

An advantage of the processing of FIGS. 1-10 is that such may enable vertical access transistors to be formed which have single crystal semiconductor material (e.g., single crystal silicon) throughout active regions (i.e., source/drain regions and channel regions) of the access transistors. Such may enable improved scalability of the vertical access transistors to higher levels of integration than may be achieved with vertical access transistors having polycrystalline semiconductor material throughout the active regions of the access transistors.

Figure 11:
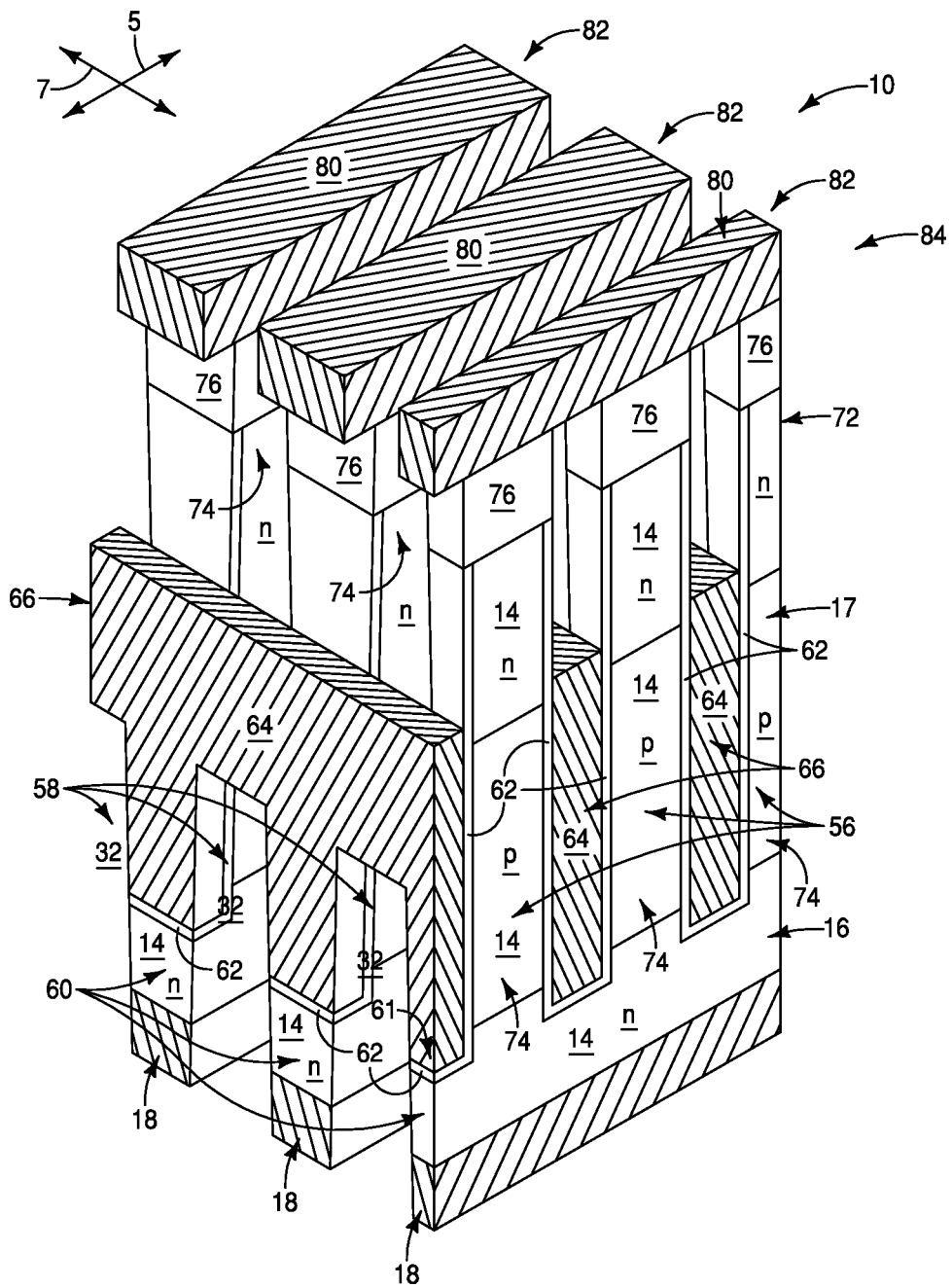
FIG. 11 is a diagrammatic three-dimensional view of the integrated arrangement of FIG. 10 showing relevant structures of a memory array.

Referring to FIG. 11, relevant electrical components of the memory array 84 are shown in isolation from some of the insulative materials in order to assist the reader in understanding the invention. The figure shows that the memory array 84 comprises a plurality of vertical access transistors 74 configured as access devices for the memory structures 76. Each vertical access transistor is between a pair of wordlines 66, and the wordlines are shared between neighboring vertical access transistors during operation of the memory array 84.

Figure 12:
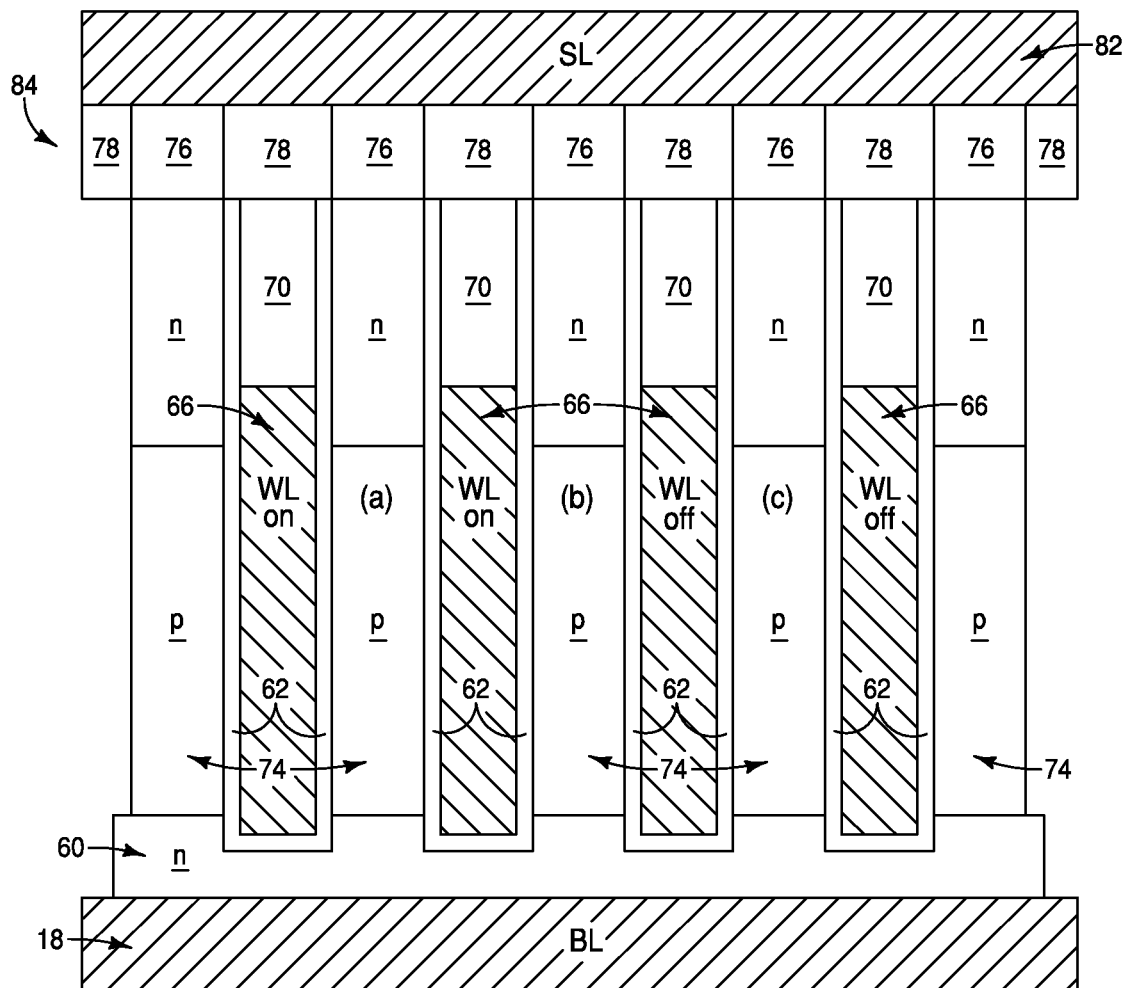
FIG. 12 is a diagrammatic cross-sectional side view across several neighboring access devices of an example memory array and illustrates example programming modes associated with the access devices.

FIG. 12 is a cross-sectional side view along a region of the memory array 84. One of the first conductive lines 18 is labeled as a bitline (BL) and one of the third conductive lines 82 is labeled as a source line (SL). Five neighboring access transistors 74 are shown in the cross-section of FIG. 12. Four wordlines 66 are shown associated with the access transistors. Three of the access transistors are labeled as (a), (b) and (c). The "ON" and "OFF" states of the wordlines 66 are described, with such states being configured to place the access transistor (a) in a fully ON mode, to place the access transistor (c) in a fully OFF mode, and to place the access transistor (b) in a HALF-ON (i.e., SEMI-ON) mode.

Figure 13:
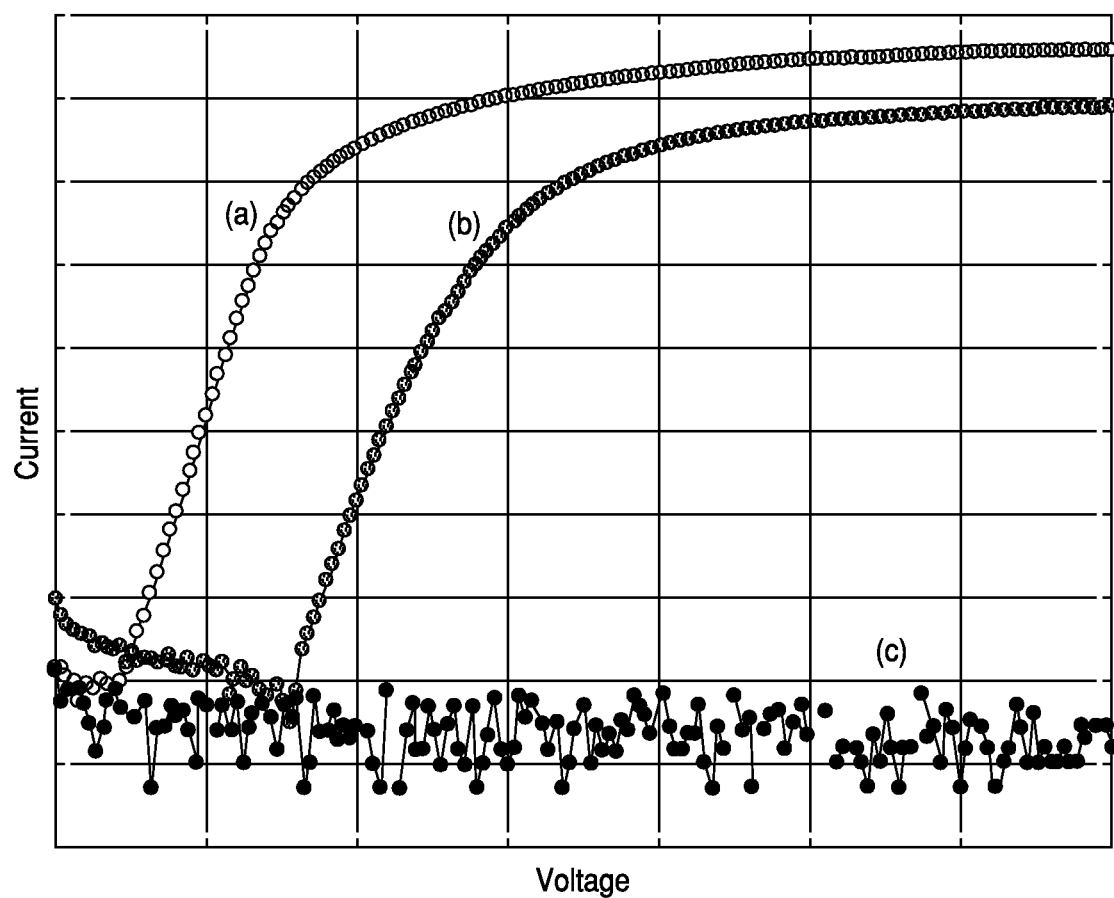
FIG. 13 graphically illustrates example current and voltage characteristics of the programming modes of FIG. 12.

FIG. 13 graphically illustrates current and voltage characteristics of the various modes of the access transistors (a), (b) and (c) of FIG. 12. The HALF-ON mode (b) has a substantially smaller current value then the ON mode (a), and accordingly may be readily distinguished from the ON mode so that the HALF-ON mode does not adversely impact reading/writing operations.

Figure 14:
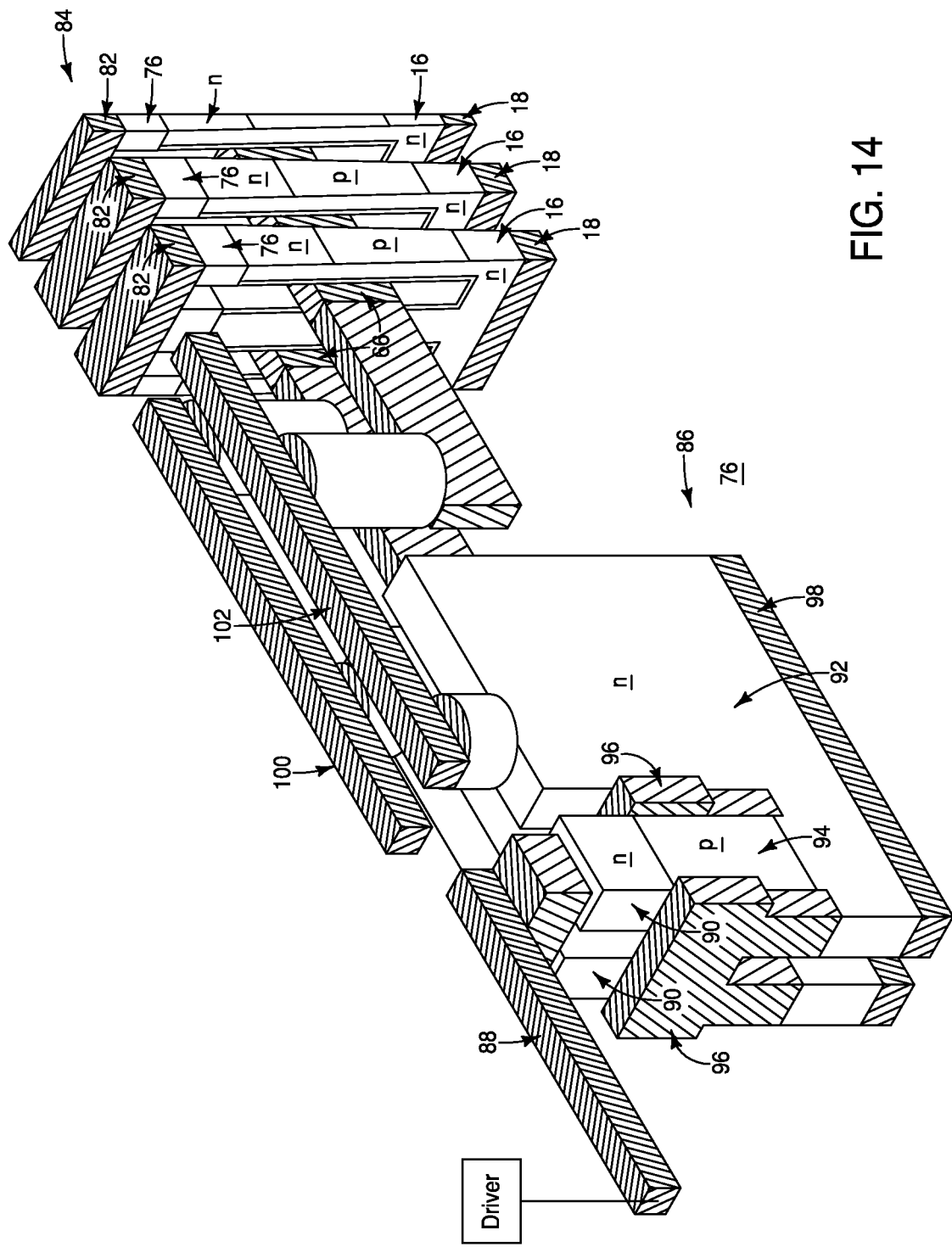
FIG. 14 is a diagrammatic three-dimensional view of an example integrated arrangement showing peripheral circuitry coupled with a region of the example access devices of FIG. 12.

Referring to FIG. 14, a peripheral circuit element 86 is shown provided proximate the memory array 84. The circuit element 86 may correspond to a switching element.

The circuit element 86 has a conductive interconnect 88 which extends to a wordline driver (labeled as "Driver"). The interconnect 88 is electrically coupled with a source/drain region 90. Such source/drain region is gatedly coupled with another source/drain region 92 through a channel region 94. The channel region is gatedly controlled through gate electrodes 96.

The source/drain region 92 is over a conductive beam 98 (e.g., a tungsten-containing beam); and is electrically coupled with a pair of conductive beams 100 and 102. The conductive beams 100 and 102 extend to a pair of neighboring wordlines 66 within the memory array 84. In operation, the switching element 86 may be utilized to simultaneously drive the illustrated two neighboring wordlines 66 within the memory array 84. For instance, ON electrical signals may be applied along interconnect 88 and along the gate electrodes 96, and such may result in the ON electrical state being provided along both of the conductive beams 100 and 102 to simultaneously provide the ON voltage along both of the illustrated neighboring wordlines 66.

Figure 15:
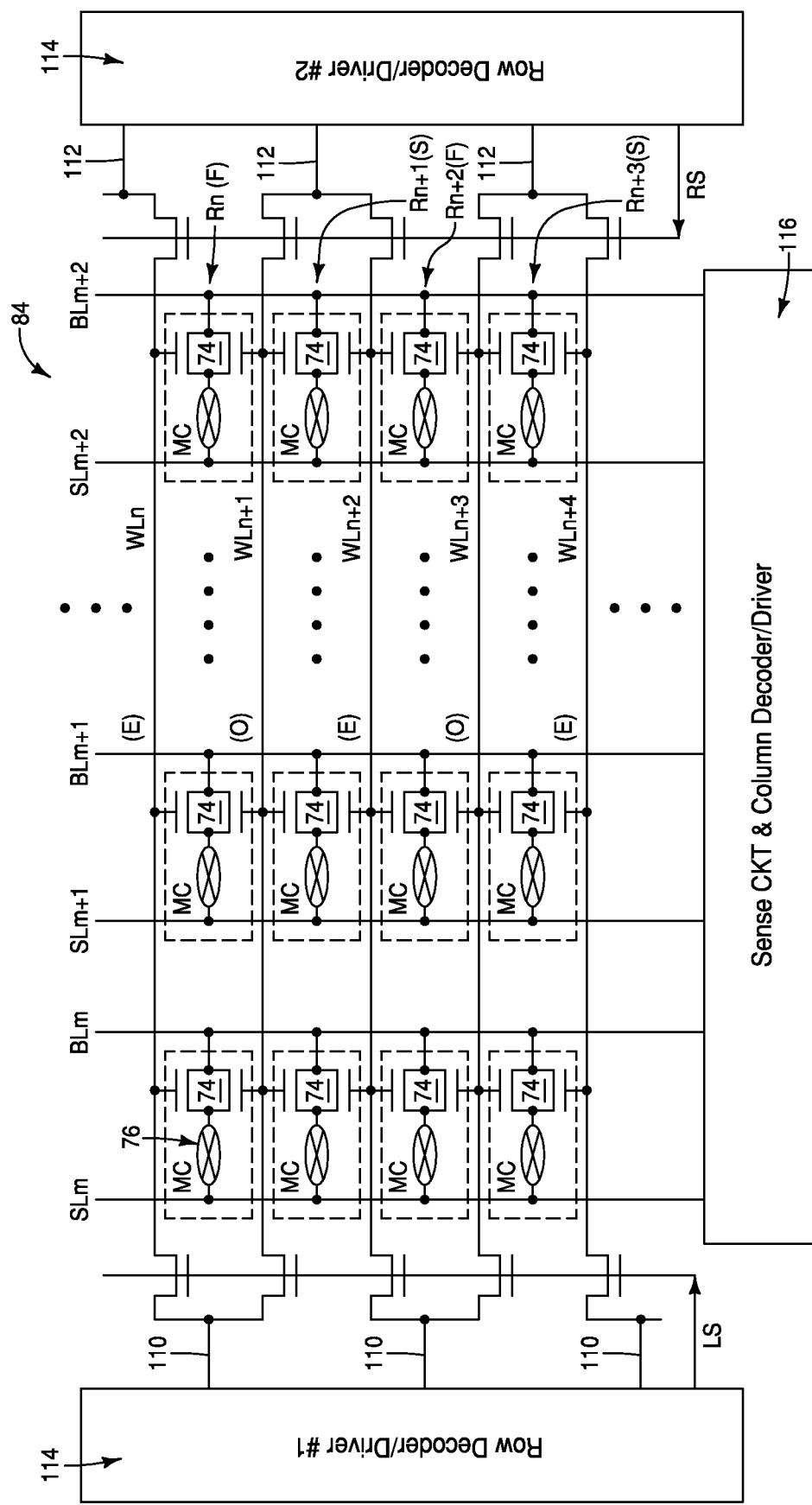
FIG. 15 schematically illustrates a region of an example memory array, and a region of peripheral circuitry adjacent to the memory array.

FIG. 15 shows a region of an example memory array 84, and shows example regions of example peripheral circuitries 114 and 116 adjacent the memory array 84. The memory array comprises a plurality of memory cells 76 (MC) and access transistors 74. Wordlines (WLn, WLn+1, etc.) are coupled with gates of the access transistors, and extend to wordline driver circuitries. In the shown embodiment, there are two wordline driver circuitries, which are labeled as Row Decoder/Driver #1 and Row Decoder/Driver #2. The wordline driver circuitries may be referred to as a first wordline driver circuitry and a second wordline driver circuitry, respectively.

Source lines (SLm, SLm+1, etc.) are coupled with the memory cells MC, and bitlines (BLm, BLm+1, etc.) are coupled with the access transistors 74. The source lines and bitlines extend to sense circuitry, column decoder circuitry, and column driver circuitry (labeled as Sense CKT & Column Decoder/Driver).

Each of the memory cells MC is uniquely addressed through a combination comprising one of the source lines, one of the bitlines and one of the wordlines.

In some embodiments, the wordlines (WLn, WLn+1, etc.) may be considered to comprise a set of even wordlines (E) and odd wordlines (O); with the terms "even" and "odd" being utilized to enable one set of wordlines to be distinguished relative to another set, and are not to be understood as indicating any substantial structural differences between the wordlines. The even and odd wordlines alternate with one another across the memory array 84.

The access transistors 74 are arranged in rows (Rn, Rn+1, etc.) across the memory array 84, with each row being between an even wordline (E) and an odd wordline (O). The access transistors comprise the semiconductor material pillars 56 (as shown in FIG. 11), and accordingly the semiconductor material pillars 56 would also be arranged in the same rows as the access transistors 74.

The rows may be considered to alternate between first rows (F) and second rows (S). Each of the rows (F and S) is associated with one of the even wordlines (E) and one of the odd wordlines (O). The even and odd wordlines (E and O) associated with each of the first rows (F) extend to first common lines 110, which in turn extend to the first wordline driver circuitry (Row Decoder/Driver #1); and the even and odd wordlines (E and O) associated with each of the second rows (S) extend to second common lines 112, which in turn extend to the second wordline driver circuitry (Row Decoder/Driver #2).

In some embodiments, FIGS. 1-15 may be considered to describe a first example method of forming vertical access transistors. Another example method is described with reference to FIGS. 16-29.

Figure 16:
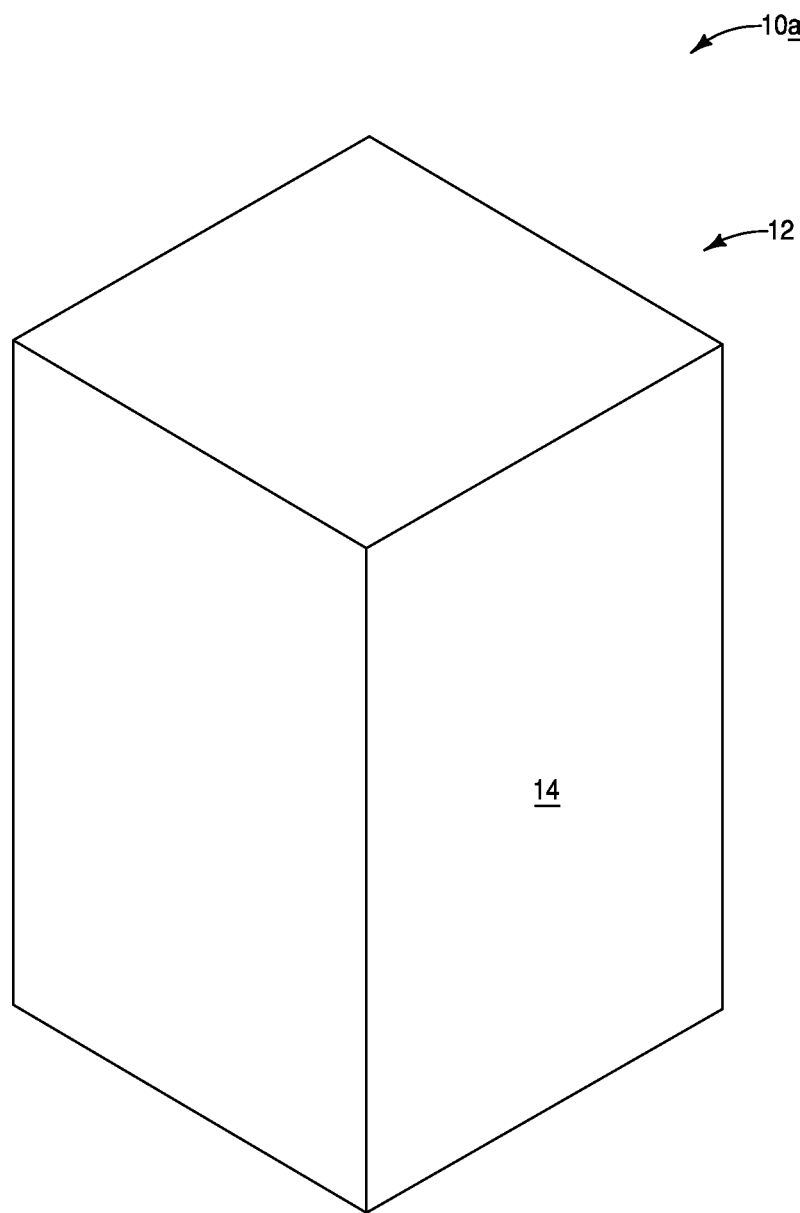
FIGS. 16-26 are diagrammatic three-dimensional views of an example integrated arrangement at example process stages of an example method for fabricating integrated circuitry.

Referring to FIG. 16, a construction 10a includes a mass 12 of the first semiconductor material 14.

Figure 17:
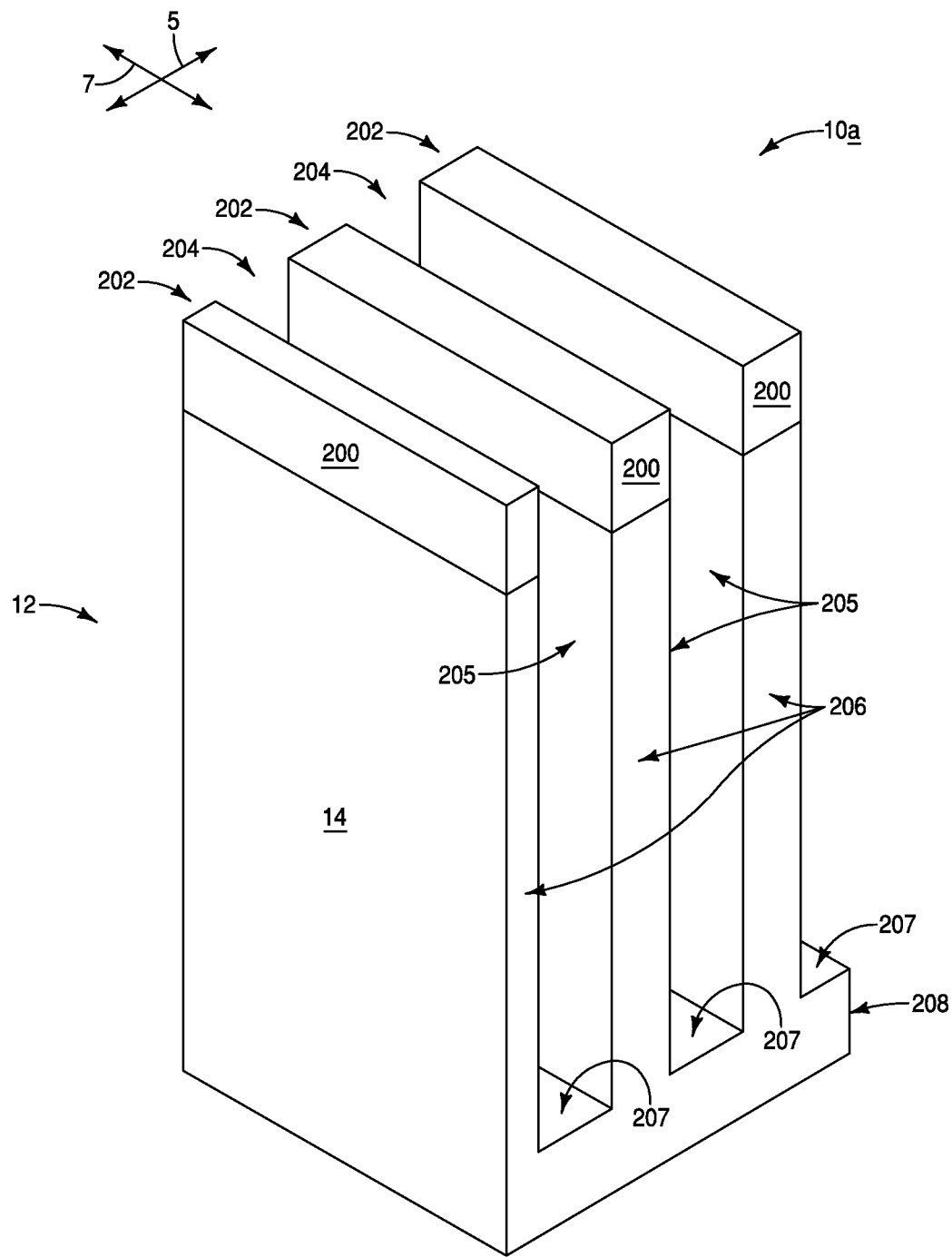

Referring to FIG. 17, masking material 200 is formed over an upper surface of the mass 12, and is patterned into lines 202. The lines 202 extend along the second direction of the axis 7.

The masking material 200 may comprise any suitable composition(s); and in some embodiments may comprise, consist essentially of, or consist of silicon nitride. The masking material may be formed to any suitable thickness, and in some embodiments may be formed to a thickness within a range of from about 10 nm to about 50 nm (e.g., about 30 nm). The lines 202 may be formed on any suitable pitch; and in some embodiments may be formed to a pitch within a range of from about 20 nm to about 100 nm (e.g., a pitch about 40 nm). The lines 202 may be formed with any suitable process; and in some embodiments may be formed utilizing a lithographically-patterned mask (not shown).

The lines 202 are utilized to pattern trenches 204 which extend into the semiconductor material 14. A portion of the semiconductor material 14 remaining under the trenches 204 may be considered to be a base 208, and portions of the semiconductor material 14 between the trenches 204 may be considered to be configured as semiconductor material walls 206. The trenches 204 may be referred to as first trenches to distinguish them from other trenches formed at subsequent process stages.

The trenches 204 may be formed with any suitable etching; such as, for example, dry etching.

The trenches 204 have sidewalls 205, and such sidewalls may be considered to be along the semiconductor material walls 206.

The trenches 204 have bottom peripheries 207, and such bottom peripheries may be considered to be over the base 208.

Figure 18:
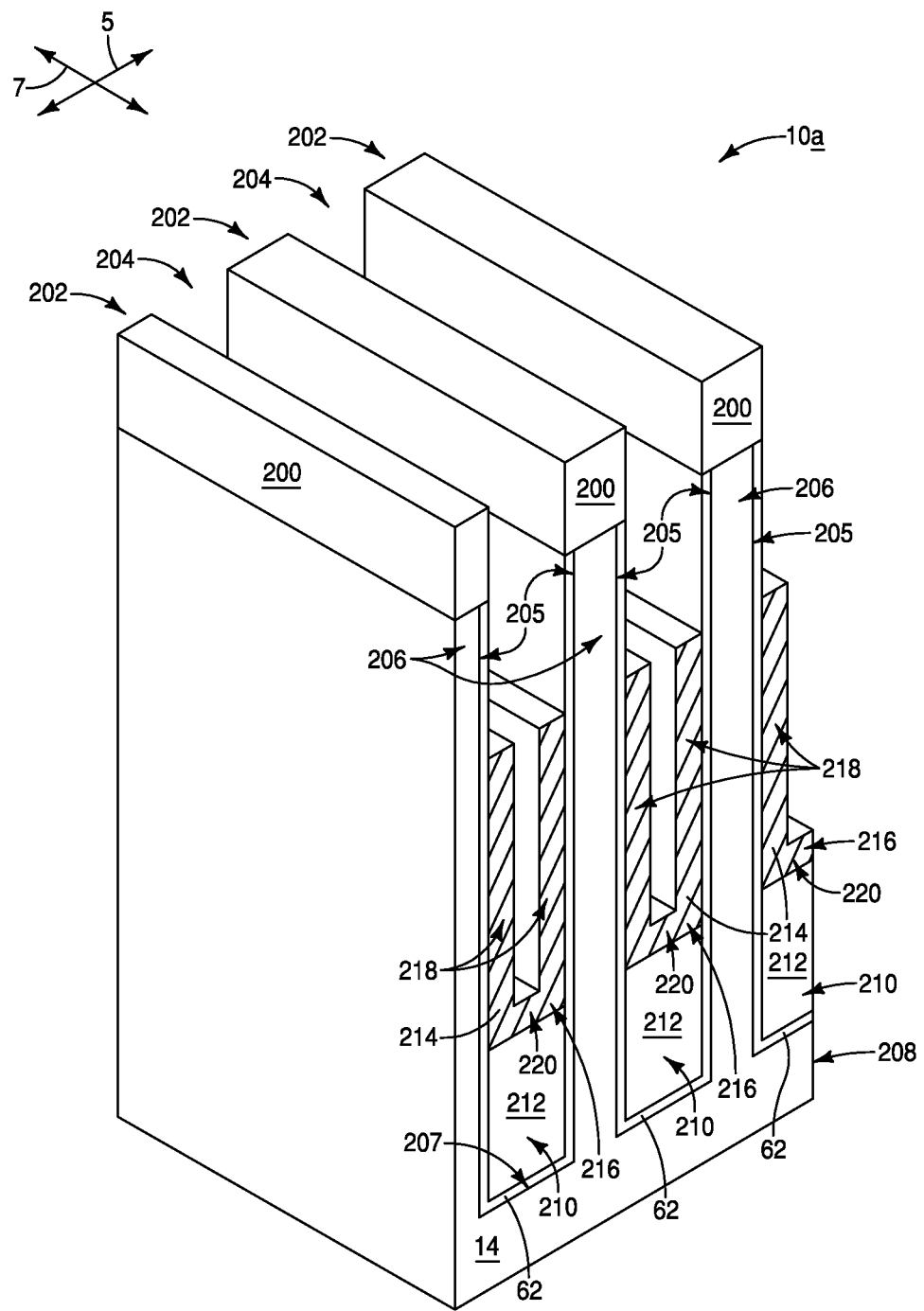

Referring to FIG. 18, the sidewalls 205 and bottom peripheries 207 of the trenches 204 are lined with dielectric material 62. Insulative steps 210 are then formed within bottom regions (i.e., along bottoms) of the trenches 204. The insulative steps comprise insulative material 212.

The insulative material 212 may comprise any suitable composition(s); and in some embodiments may comprise, consist essentially of, or consist of silicon dioxide. In some embodiments, the insulative steps may be formed by forming the material 212 within the trenches 204 utilizing a spin-coating method, followed by appropriate etching (e.g., wet etching) to recess the material 212 within the trenches. In some embodiments, the trenches 204 may be formed to depths within a range of from about 100 nm to about 300 nm (e.g., about 200 nm), and the steps 210 may be formed to a suitable thickness is such that the remaining portion of the trench has a depth within a range of from about 80 nm to about 200 nm (e.g., about 160 nm).

Conductive material 214 is formed within the trenches 204 and over the insulative steps 210. The conductive material 214 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 214 may comprise, consist essentially of, or consist of titanium nitride.

The conductive material 214 may be formed to any suitable thickness; and in some embodiments may comprise a thickness within a range of from about 2 nm to about 10 nm (e.g., about 4 nm).

The conductive material 214 is configured as conductive beams 216 which extend along the second direction of the axis 7. Each of the conductive beams 216 is configured as an upwardly-opening container shape. Specifically, each of the beams 216 comprises a pair of sidewall regions 218 joined to one another through an interconnect region 220.

The conductive beams 216 are recessed within the trenches 204. Such recessing may be accomplished with any suitable processing. Suitable processing will be readily recognized by persons of ordinary skill in the art.

Figure 19:
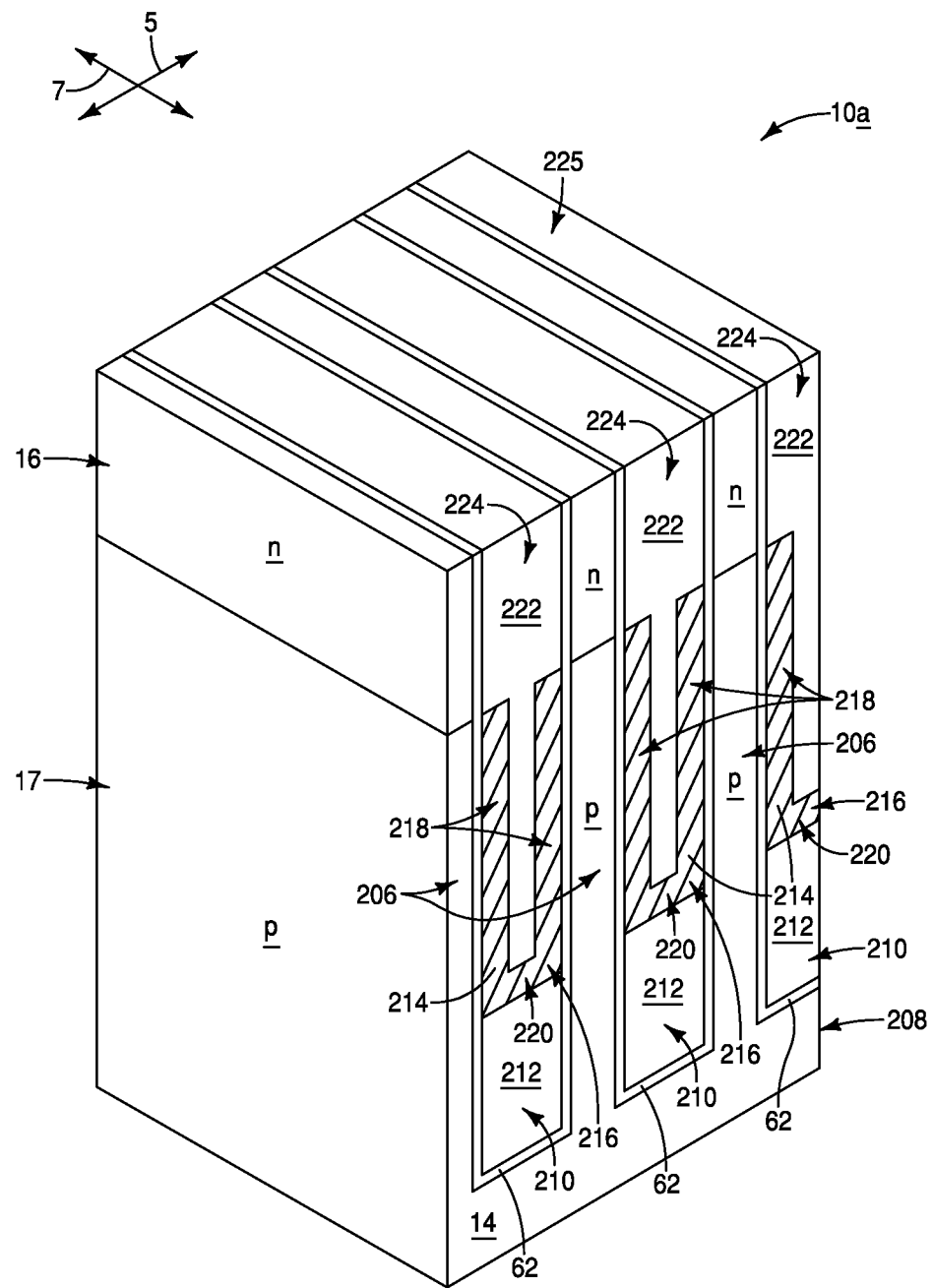

Referring to FIG. 19, insulative material 222 is formed within the trenches 204 (labeled in FIG. 18) and over the conductive beams 216. The insulative material 222 may be considered to form insulative regions 224. The insulative material 222 may comprise any suitable composition(s); and in some embodiments may comprise, consist essentially of, or consist of silicon nitride.

N-type region 16 and p-type region 17 are formed within the semiconductor material 14 utilizing suitable processing (e.g., appropriate implanting). In other embodiments, the regions 16 and 17 may correspond to a p-type region and an n-type region, respectively. In some embodiments, the regions 16 and 17 may be formed at a processing stage other than that of FIG. 19. For instance, in some embodiments the regions 16 and 17 may be present at the processing stage of FIG. 16.

A planarized surface 225 is formed across the materials 14, 62 and 222 of construction 10a. Such planarized surface may be formed utilizing any suitable processing; such as, for example, CMP.

Figure 20:
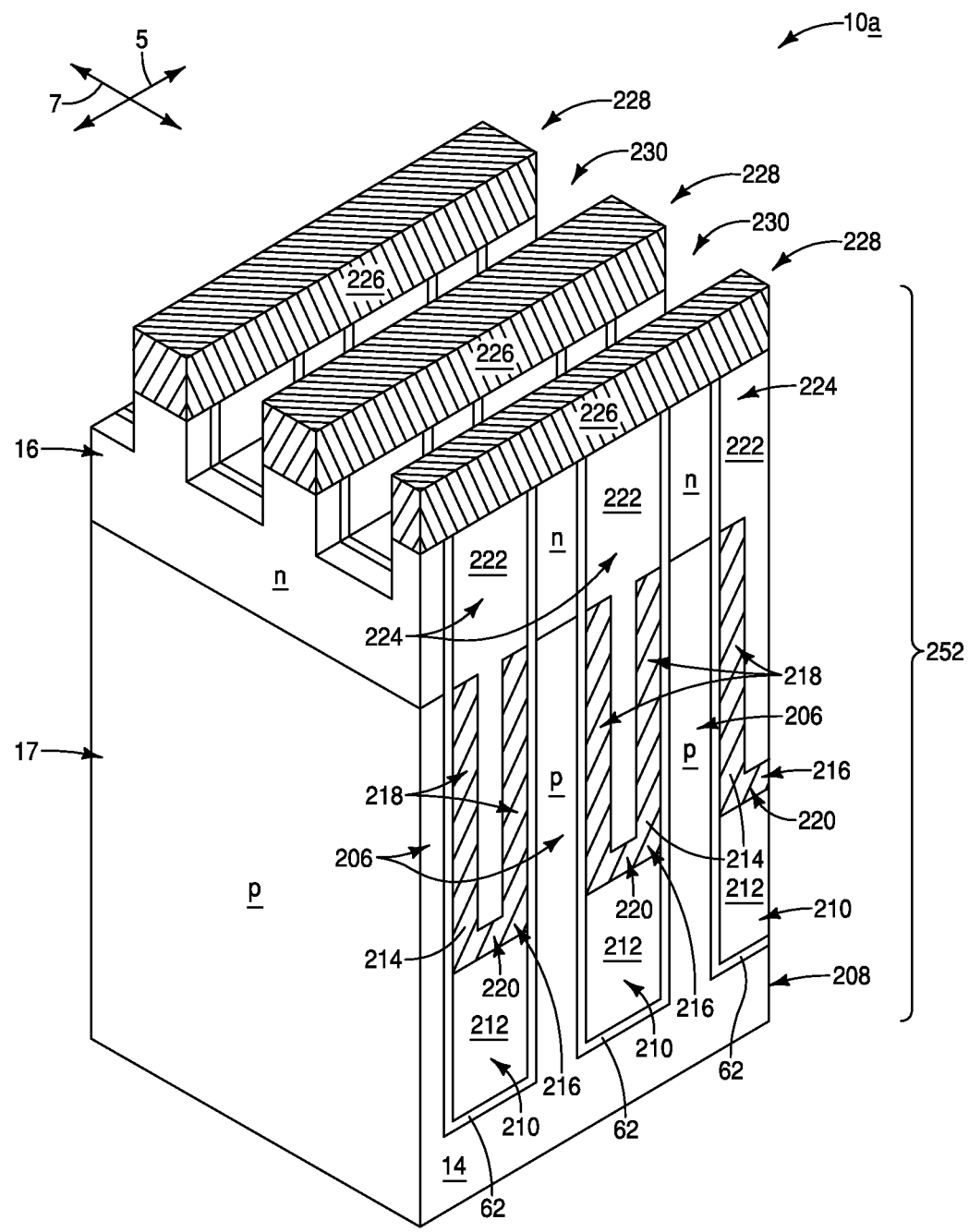

Referring to FIG. 20, conductive material 226 is formed over the planarized surface 225 (FIG. 19) and patterned into lines 228. The lines 228 may be formed with any suitable processing, including, for example, utilization of a lithographically-patterned mask (not shown).

The conductive material 226 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 226 may comprise, consist essentially of, or consist of tungsten. The tungsten may be formed to any suitable thickness; such as, for example, a thickness of from about 10 nm to about 50 nm (e.g. about 20 nm).

In some embodiments, the lines 228 may be referred to as first conductive lines to distinguish them from other conductive lines.

The conductive lines 228 extend along the first direction of the axis 5. In the shown embodiment, the lines 228 extends across the insulative regions 224 and the semiconductor material walls 206.

The conductive lines 228 are utilized to pattern second trenches 230. The second trenches 230 are formed between the conductive lines 228, and extend into the semiconductor material walls 206 to a level which is above a top level of the upwardly-opening container-shaped conductive beams 216. The second trenches 230 extend into, but not through, the n-type doped regions 16.

In some embodiments, the semiconductor material 14 and other associated materials and structures of the construction 10a at the process stage of FIG. 20 may be considered together to form a first assembly 252.

Figure 21:
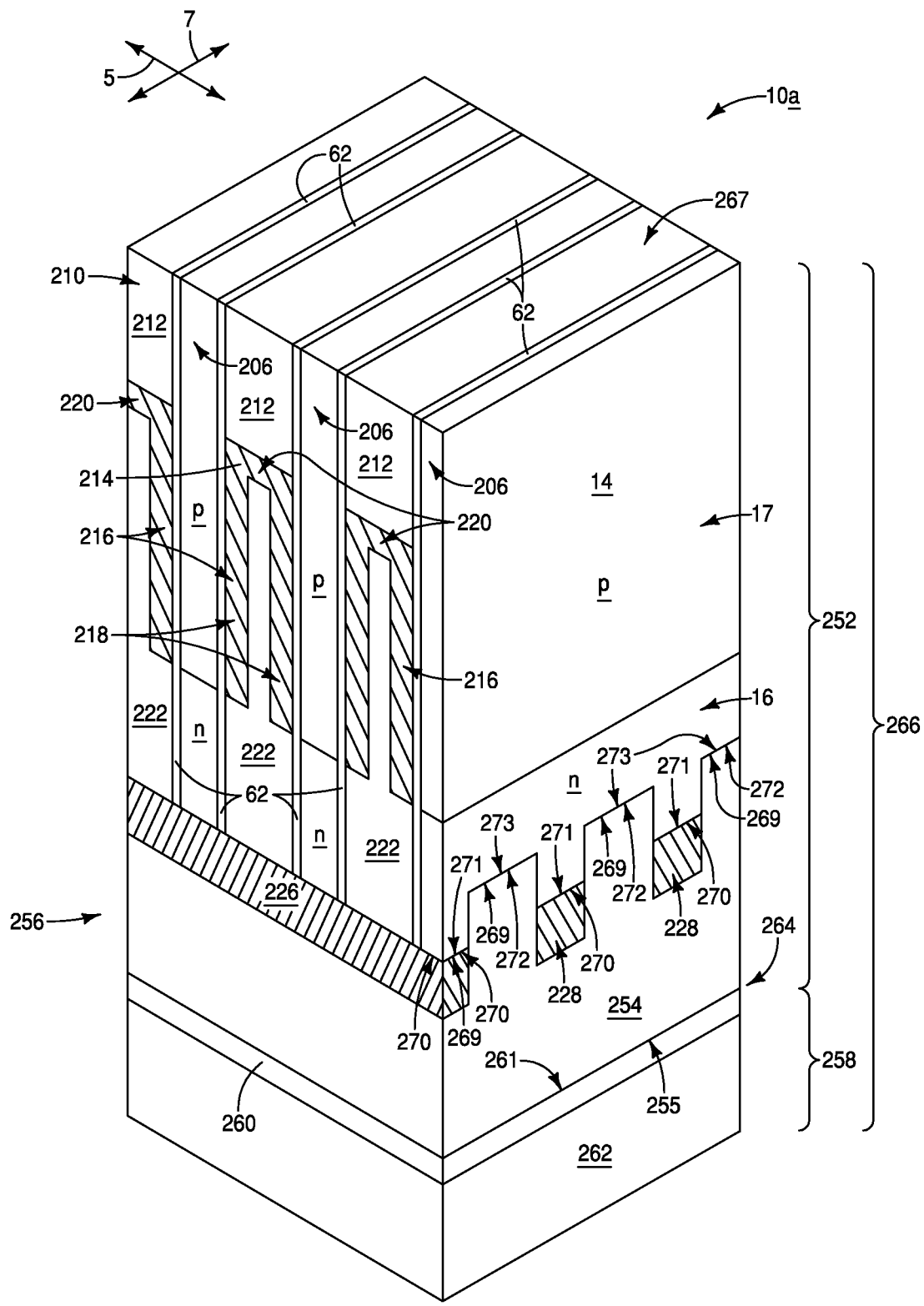

Referring to FIG. 21, an insulative mass 256 is formed within the second trenches 230 (FIG. 20) and over the conductive lines 228, and then the first assembly 252 is inverted. The insulative mass 256 comprises insulative material 254. The insulative material 254 may comprise any suitable composition(s); and in some embodiments may comprise, consist essentially of, or consist of silicon dioxide.

In some embodiments, the insulative material 254 may be considered to be a dielectric bonding material. The dielectric bonding material 254 has a surface 255. The dielectric bonding material 254 may be referred to as a first dielectric bonding material.

The inverted first assembly 252 is bonded to a second assembly 258. The second assembly 258 includes a dielectric bonding material 260 over a semiconductor material 262. In some embodiments, the dielectric bonding material 260 may be referred to as a second dielectric bonding material to distinguish it from the first dielectric bonding material 254. In some embodiments, the semiconductor material 262 may be referred to as a second semiconductor material to distinguish it from the first semiconductor material 14.

The second semiconductor material 262 may comprise any of the semiconductor compositions described above relative to the first semiconductor material 14. The second semiconductor material 262 may comprise a same composition as the first semiconductor material 14, or may comprise a different composition relative to the first semiconductor material 14. In some embodiments, the first and second semiconductor materials 14 and 262 may both comprise, consist essentially of, or consist of monocrystalline silicon.

The second dielectric bonding material 260 has a surface 261. The surface 255 of the first dielectric bonding material 254 is bonded to the surface 261 of the second dielectric bonding material 260 to form a dielectric bonding region 264. The bonded assemblies 252 and 258 may be considered together to form a third assembly 266.

An upper surface of the third assembly 266 would initially comprise the base 208 (shown at the bottom of the first assembly 252 at the processing stage of FIG. 20), but such base is removed with an appropriate polishing process (e.g., CMP) to form a planarized upper surface 267 of the third assembly 266 at the processing stage of FIG. 21. The planarized upper surface 267 extends across the insulative material 212 of steps 210, across the dielectric material 62, and across the semiconductor material walls 206.

The construction 10a of FIG. 21 may be considered to be an integrated arrangement which includes all of the materials and structures of the third assembly 266.

It is noted that the conductive beams 216 of assembly 266 of FIG. 21 are now configured as downwardly-opening container shapes. Each of the downwardly-opening container shapes comprises the pair of sidewall regions 218, and comprises the interconnect region 220 as a top region extending across the sidewall regions.

The assembly 266 may be considered to have the first conductive lines 228 over the dielectric bonding region 264. The conductive lines 228 extend along the first direction of axis 5. The conductive beams 216 are over the conductive lines 228, and are spaced from one another by the semiconductor material walls 206 and the dielectric material 62. The semiconductor material walls 206 and the conductive beams 216 extend along the second direction of axis 7. The second direction of axis 7 intersects the first direction of axis 5; and in some embodiments may be substantially orthogonal to the first direction of axis 5.

The conductive beams 216 and the semiconductor material walls 206 alternate with one another along the first direction of axis 5.

The semiconductor material walls 206 have bottom surfaces 269. Such bottom surface undulate over top surfaces 271 of the conductive lines 228, and top surfaces 273 of the insulative material 254. In some embodiments, the bottom surfaces 269 of the semiconductor material walls 206 may be considered to have first regions 270 over the upper surfaces 271 of the conductive lines 228, and to have second regions 272 over the upper surfaces 273 of insulative material 254; with the second regions 272 being higher than the first regions 270.

Figure 22:
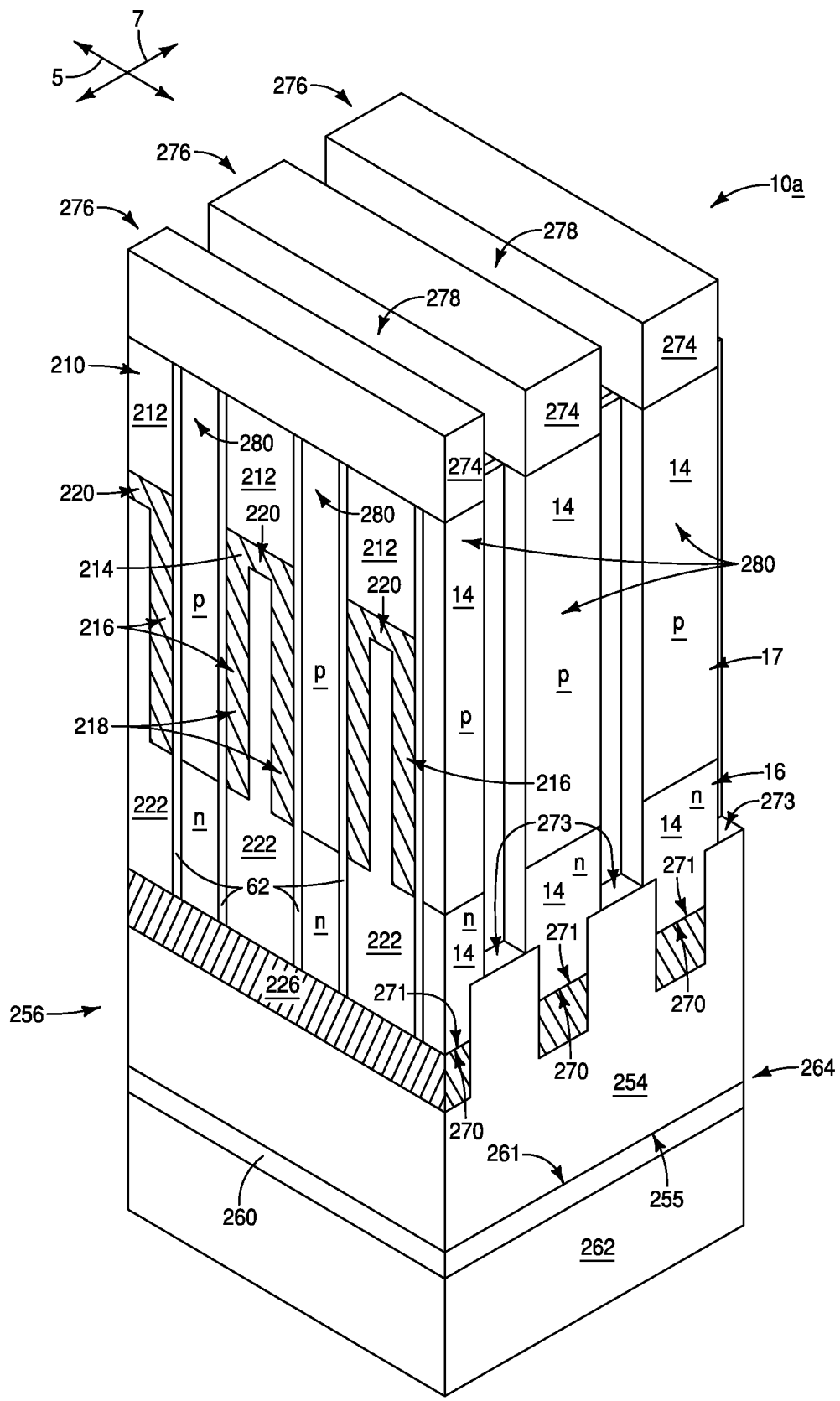

Referring to FIG. 22, masking material 274 is formed over the planarized surface 267 (shown in FIG. 21) and is patterned into lines 276. The masking material 274 may comprise any suitable composition(s); and in some embodiments may comprise, consist essentially of, or consist of silicon nitride. The masking material 274 may have any suitable thickness; and in some embodiments may have a thickness within a range of from about 10 nm to about 60 nm (e.g., about 30 nm). The lines 276 may be formed on any suitable pitch; and in some embodiments may be formed to a pitch within a range of from about 20 nm to about 60 nm (e.g., about 40 nm). The lines 276 may be formed with any suitable process; and in some embodiments may be formed by transferring a pattern from a lithographically-patterned mask (not shown).

The lines 276 are spaced from one another by openings (i.e., gaps) 278. Etching (e.g., dry etching) is conducted to remove portions of the semiconductor material walls 206 (labeled in FIG. 21) exposed within the openings 278. The semiconductor material 14 of the semiconductor material walls 206 is removed selectively relative to other materials exposed within the openings 278. In other words, regions of the openings 278 are extended downwardly through the semiconductor material walls. Such forms semiconductor material pillars 280 from the semiconductor material walls 206 (i.e., such patterns the semiconductor material walls 206 into semiconductor material pillars 280). The semiconductor material pillars 280 extend upwardly from the upper surfaces 271 of the conductive lines 228; and accordingly comprise the first regions 270 of the bottom surfaces of the walls 206 (with such first regions having been described above with reference to FIG. 21).

The openings 278 extend downwardly to the upper surfaces 273 of the insulative material 254.

Figure 23:
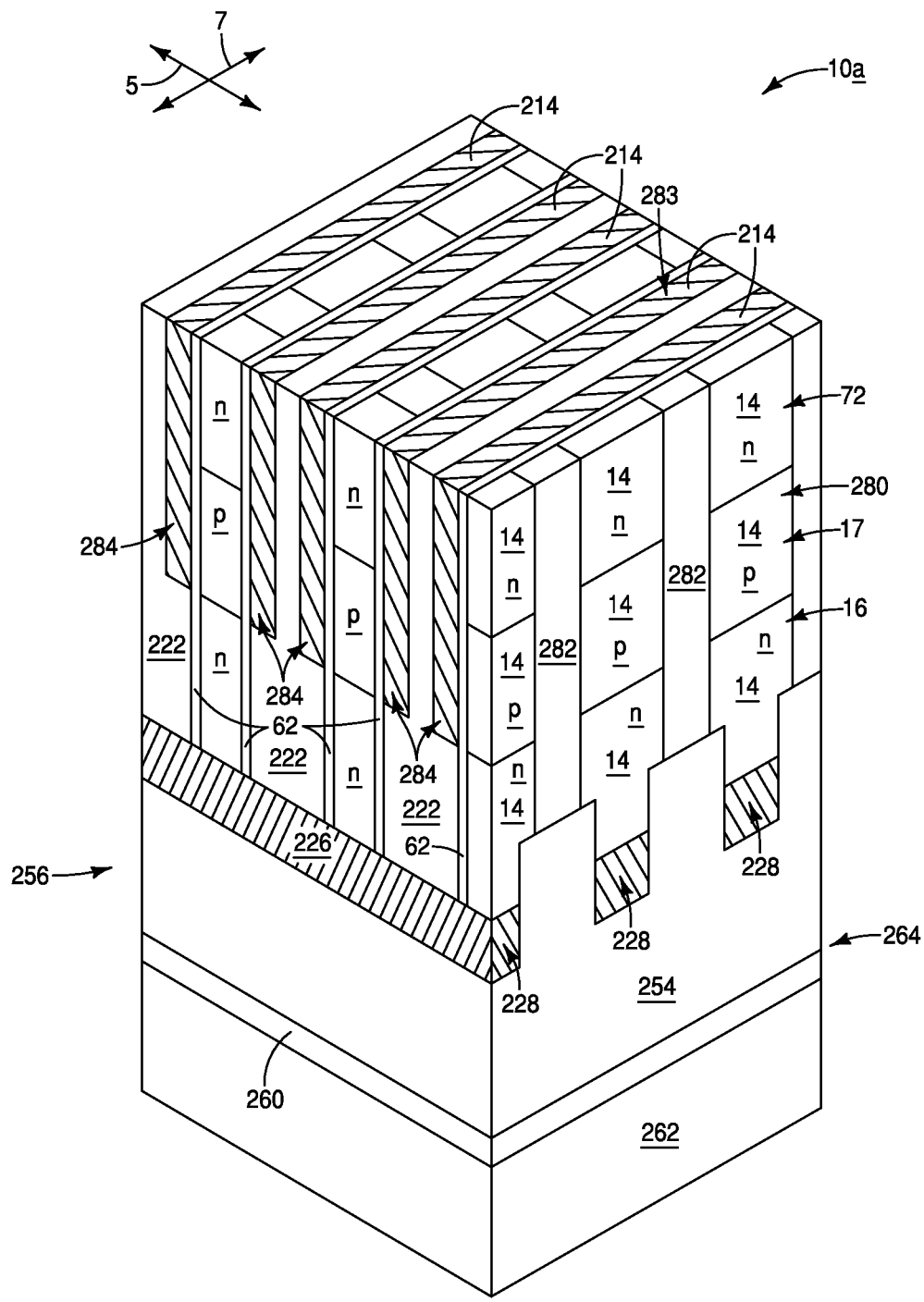

Referring to FIG. 23, the openings 278 (shown in FIG. 22) are filled with insulative material 282. The insulative material 282 may comprise any suitable composition(s); and in some embodiments may comprise, consist essentially of, or consist of silicon nitride.

After the openings 278 are filled with the insulative material 282, polishing (e.g., CMP) is conducted to remove the masking material 274 (shown in FIG. 22). The polishing forms a planarized upper surface 283 extending across the semiconductor material 14, conductive material 214, dielectric material 62 and insulative material 282. The polishing removes portions of the conductive beams 216 (shown in FIG. 22). The polishing specifically removes the top regions 220 (shown in FIG. 22) of such conductive beams; and thereby forms spaced-apart conductive lines 284 from remaining portions of the sidewall regions 218 of the conductive beams 216 (shown in FIG. 22).

The conductive lines 284 extend along the second direction of axis 7. The conductive lines 284 may be referred to as second conductive lines to distinguish them from the first conductive lines 228.

Upper regions of the semiconductor material pillars 280 are doped with n-type dopant to form the n-type doped regions 72. Such doping they be accomplished with any suitable processing; such as, for example, a suitable implant.

Figure 24:
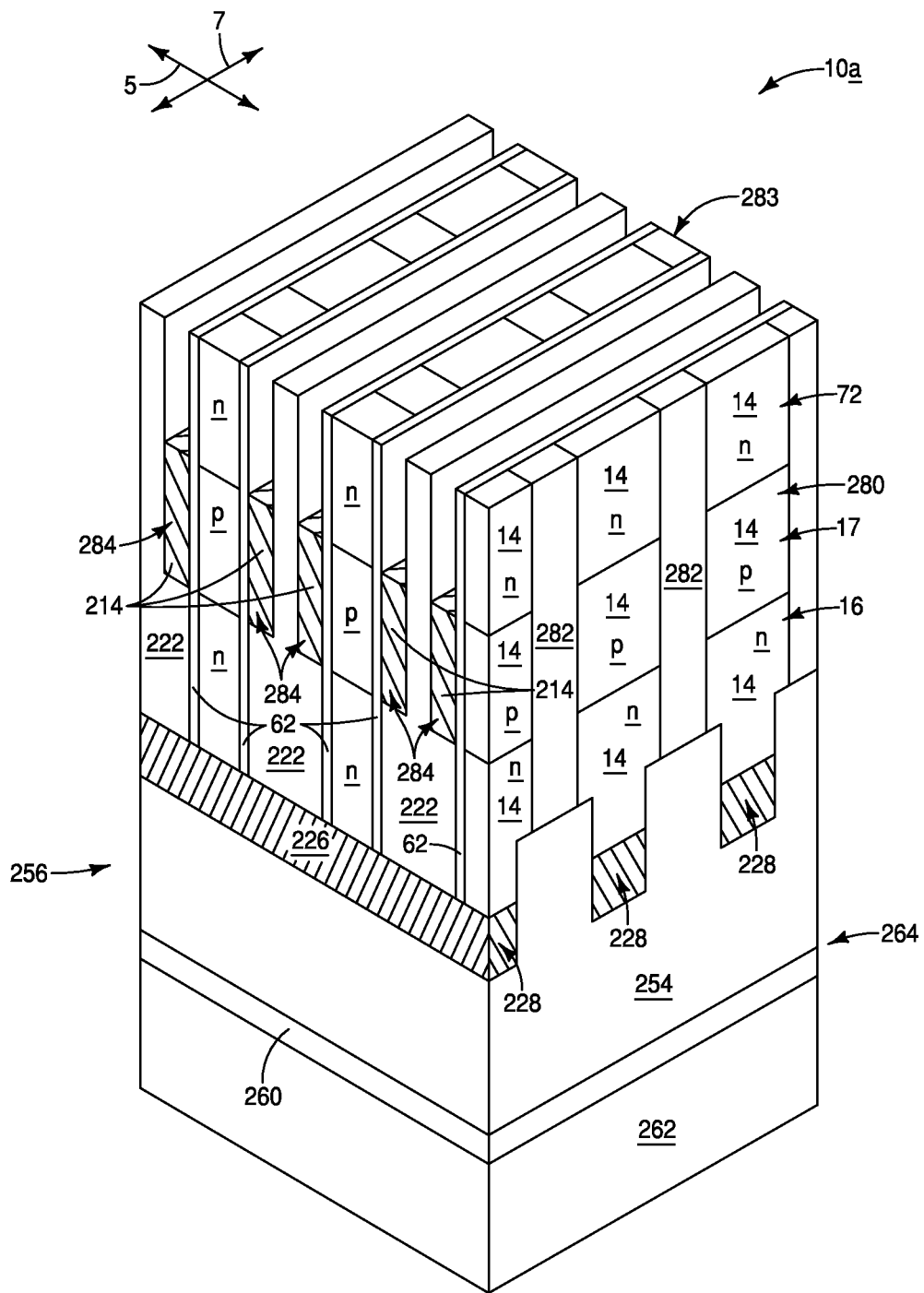

Referring to FIG. 24, upper surfaces of the conductive lines 284 are recessed relative to the planarized surface 283. Such recessing may be accomplished utilizing any suitable processing; such as, for example, a wet etch selective for the conductive material 214 relative to the materials 62, 282 and 14.

Figure 25:
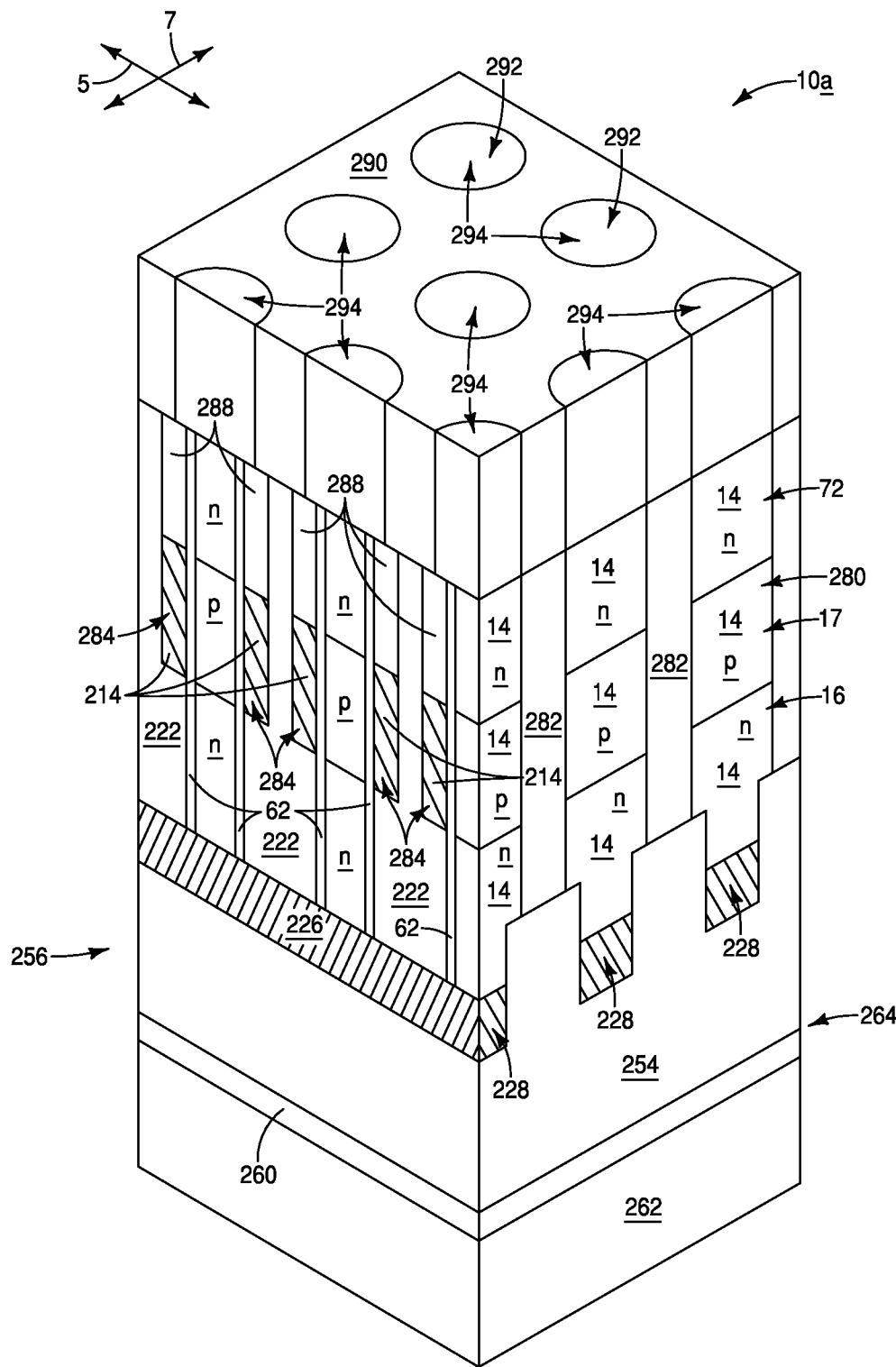

Referring to FIG. 25, insulative material 288 is formed over the recessed lines 284, and patterned insulative material 290 is formed over the upper surface 283 (FIG. 24). The insulative materials 288 and 290 may comprise any suitable composition(s); including, for example, one or both of silicon nitride and silicon dioxide. For instance, material 288 may comprise silicon nitride while material 290 comprises silicon dioxide.

The patterned insulative material 290 has openings 292 extending therethrough to expose upper surfaces of the semiconductor material pillars 280. Memory structures 294 are formed within such openings.

The memory structures 294 may be configured for utilization in resistive RAM cells, MRAM cells, STT-MRAM cells, etc. For instance, in some embodiments the memory structures 294 may comprise pinned magnetic layers, free magnetic layers, and tunnel barrier layers between the pinned and free magnetic layers; and accordingly may comprise magnetic tunnel junctions (MTJs) of the type utilized in MRAM cells, (e.g., STT-MRAM cells).

Figure 26:
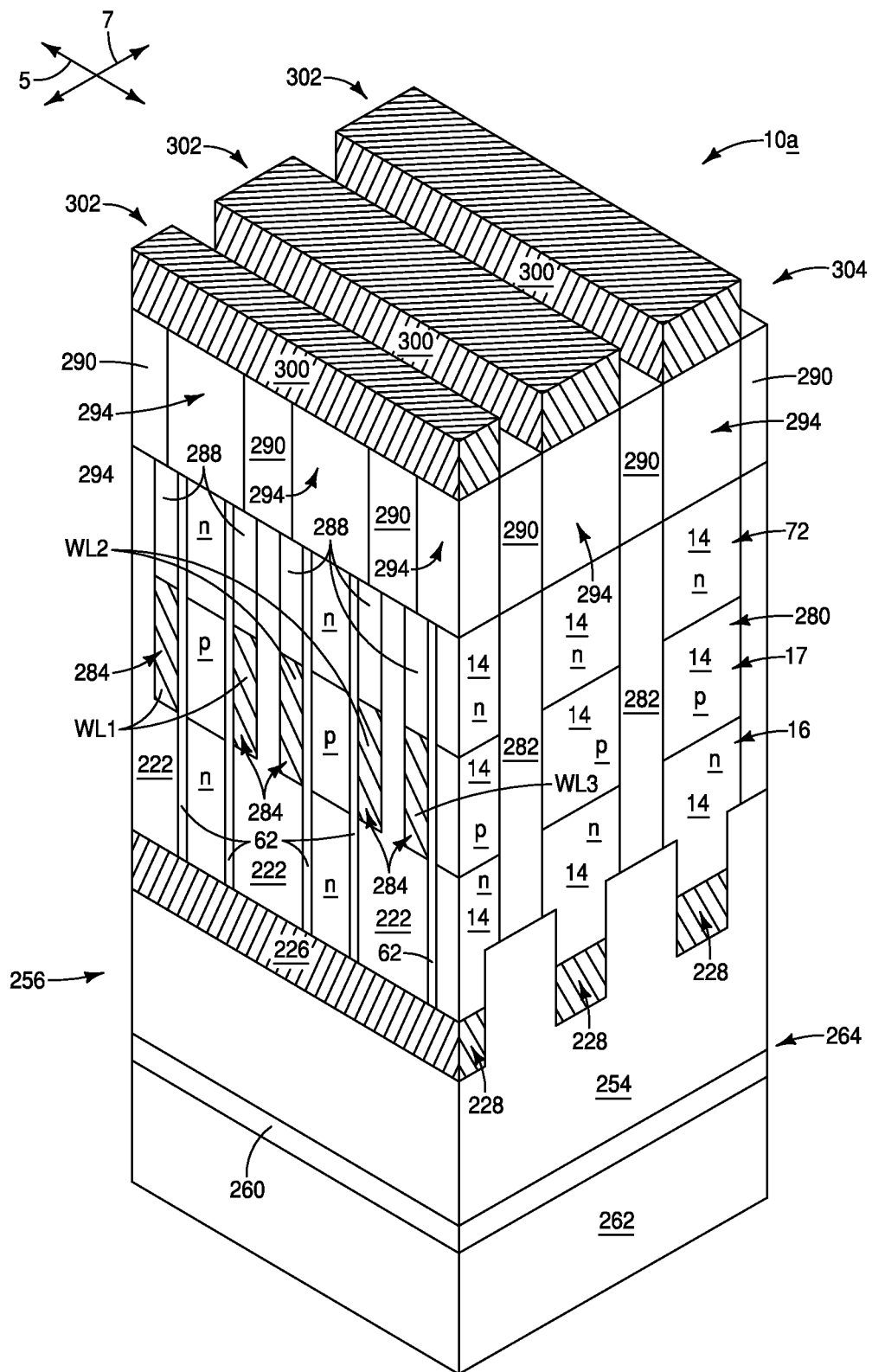

Referring to FIG. 26, conductive material 300 is formed over the memory structures 294 and is patterned into conductive lines 302. The conductive material 300 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 300 may comprise, consist essentially of, or consist of tungsten. The conductive material 300 may be formed to any suitable thickness, and in some embodiments may be formed to a thickness within a range of from about 10 nm to about 50 nm (e.g., about 20 nm).

The conductive lines 302 extend along the first direction of the axis 5.

In some embodiments, the conductive lines 302 may be referred to as third conductive lines to distinguish them from the first conductive lines 228 and the second conductive lines 284.

Each of the memory structures 294 forms a memory cell. In some embodiments, the memory cells 294 correspond to MRAM cells (e.g. STT-MRAM cells) of a memory array 304. The first conductive lines 228 are bitlines or source lines associated with such memory array; the third conductive lines 302 are the other of bitlines and source lines associated with the memory array; and the second conductive lines 284 are wordline components associated with the memory array. The wordline components on each side of a semiconductor pillar are paired with one another to form a wordline (shown as wordlines WL1, WL2 and WL3; with only one of the wordline components of WL3 being shown in FIG. 26). Each individual memory structure 294 is uniquely addressed through a combination comprising one of the first conductive lines 228, a pair of the second conductive lines 284 (e.g., one of the wordlines WL1, WL2 and WL3), and one of the third conductive lines 302. An example memory array is described in more detail below with reference to FIG. 29.

An advantage of the processing of FIGS. 16-26 is that such may enable vertical access transistors to be formed which have single crystal silicon material (e.g., single crystal silicon) throughout source/drain regions and channel regions of the access transistors. Such may enable improved scalability of the access transistors to higher levels of integration than may be achieved with vertical access transistors having polycrystalline semiconductor material throughout the source/drain regions and channel regions.

Figure 27:
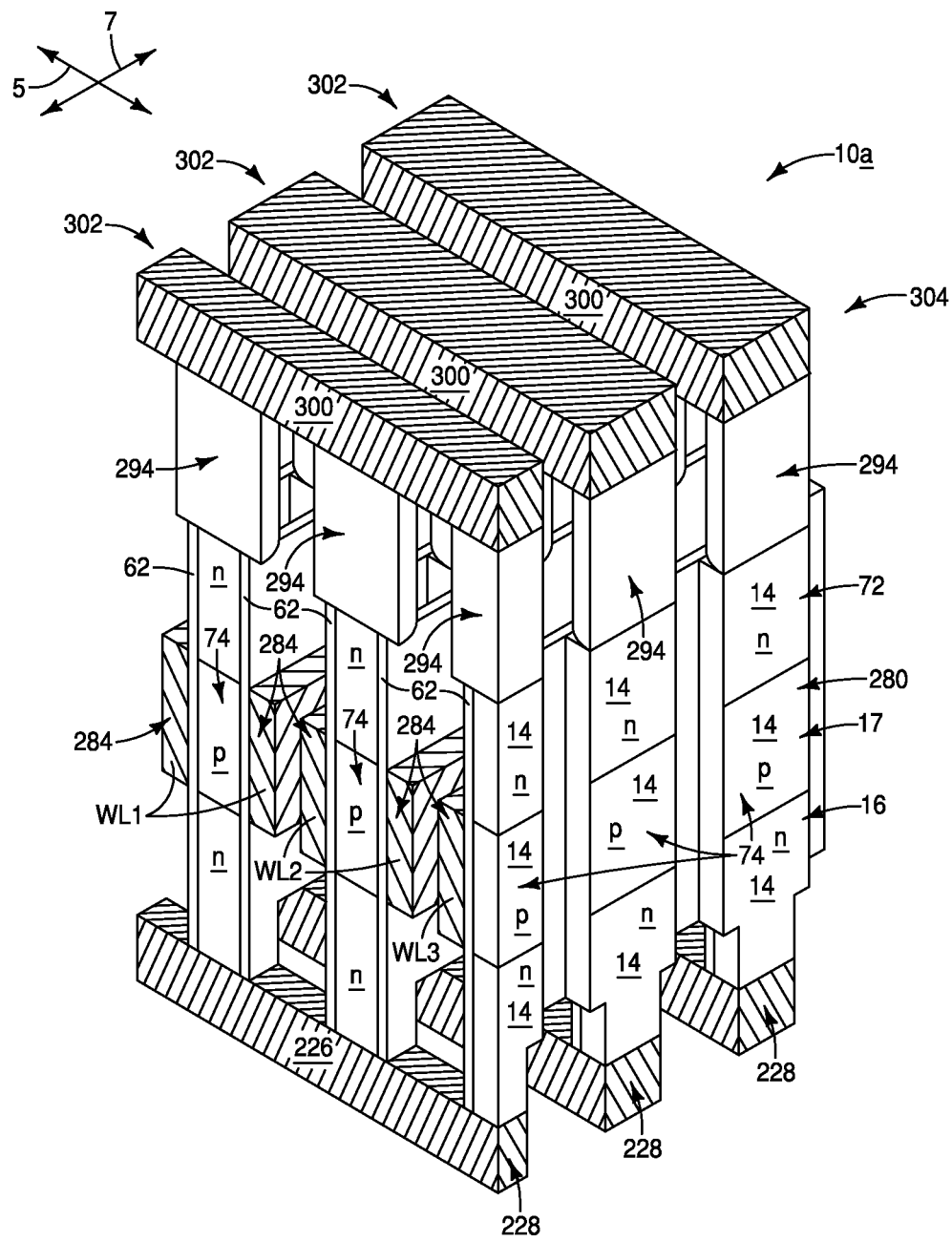
FIG. 27 is a diagrammatic three-dimensional view of the integrated arrangement of FIG. 26 showing relevant structures of a memory array.

Referring to FIG. 27, relevant electrical components of the memory array 304 are shown in isolation from some of the insulative materials in order to assist the reader in understanding the invention. The figure shows that the memory array 304 comprises a plurality of vertical transistors 74 configured as access devices for the memory structures 294. Each vertical transistor is between a pair of wordline components 284, and the paired wordline components together form wordlines (e.g., WL1, WL2 and WL3; with only one of the wordline components of WL3 being shown in FIG. 27).

Figure 28:
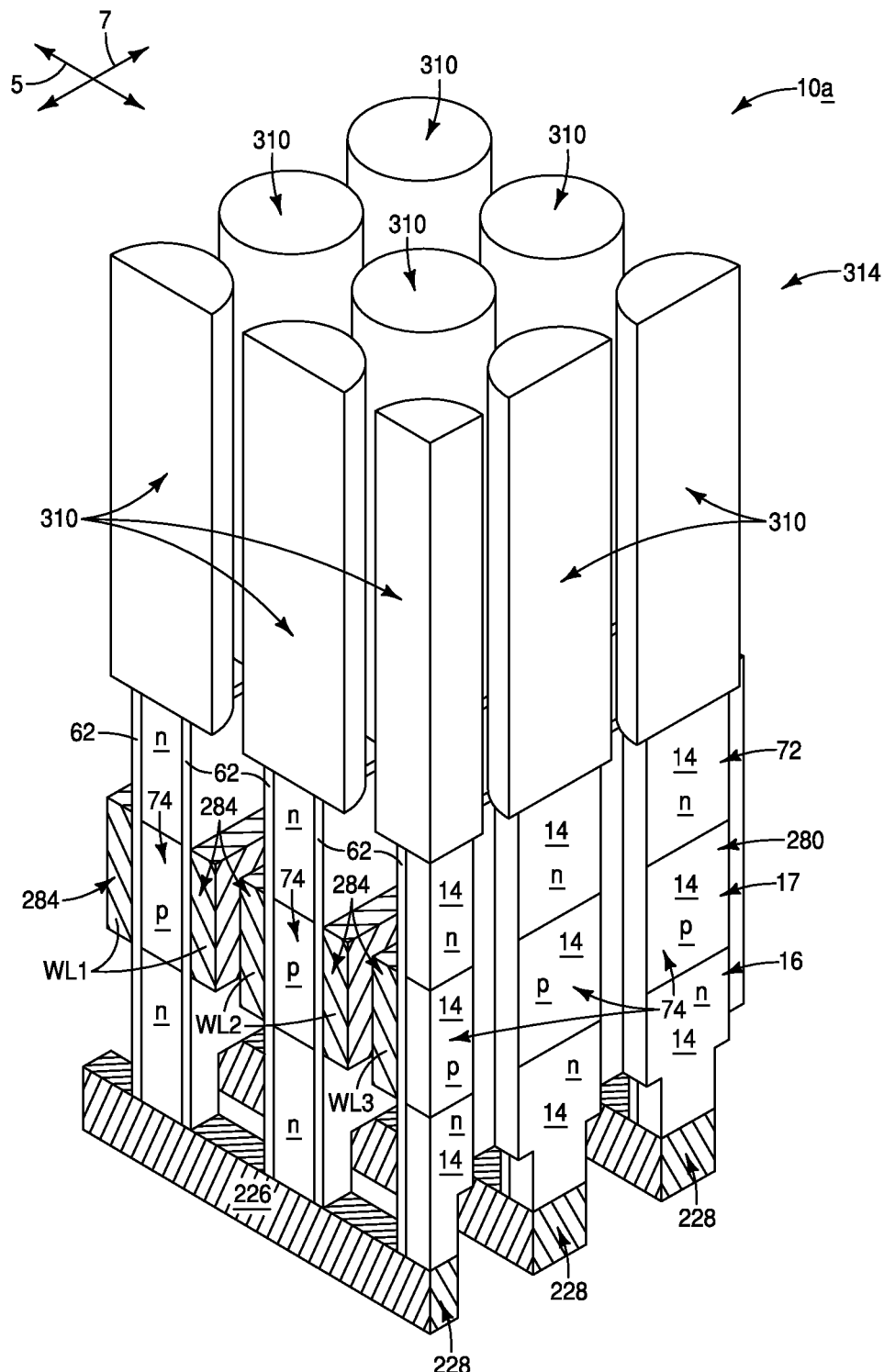
FIG. 28 is a diagrammatic three-dimensional view of another example integrated arrangement.

The memory array 304 of FIG. 27 is an example application for the vertical access transistors 74. However, it is to be understood that the vertical access transistors may be utilized in other applications. For instance, FIG. 28 shows an alternative memory array 314 which utilizes capacitors 310 (or other suitable charge-storage devices) as memory structures of memory cells. In some applications, the memory array 314 and may be a DRAM array having memory cells comprising the capacitors 310.

Figure 29:
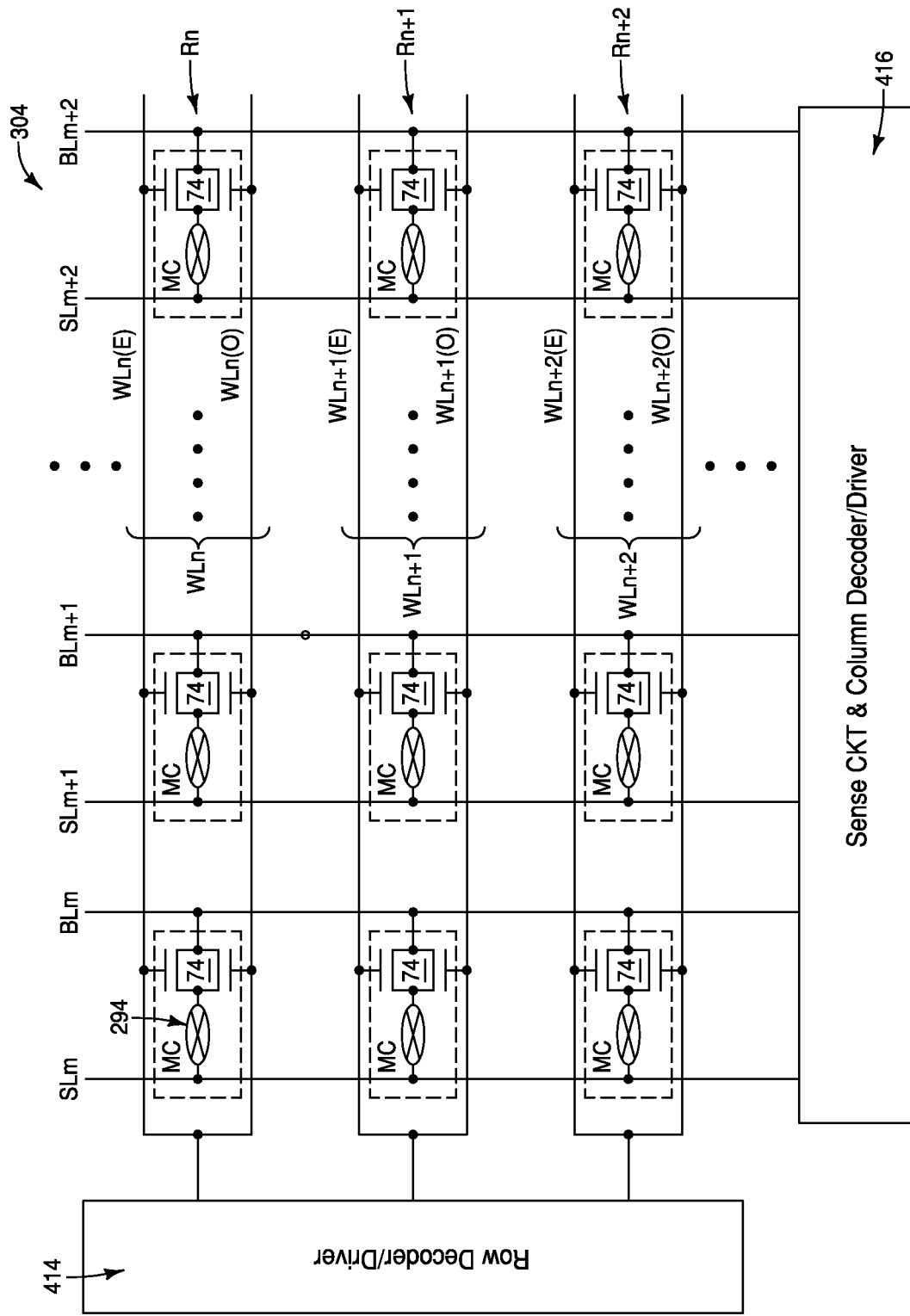
FIG. 29 schematically illustrates a region of an example memory array, and a region of peripheral circuitry adjacent to the memory array.

FIG. 29 shows a region of an example memory array 304 of the type described in FIGS. 26 and 27, and shows example regions of example peripheral circuitries 414 and 416 adjacent the memory array 304. The memory array comprises a plurality of memory cells 294 (MC) and access transistors 74. Wordlines (WLn, WLn+1, etc.) are coupled with gates of the access transistors, and extend to wordline driver circuitry (labeled as Row Decoder/Driver). Each wordline comprises a first component (e.g., WLn(E)) and a second component (e.g., WLn(O)). The first components may be referred to as even components, and the second components may be referred to as odd components. The terms "even" and "odd" are utilized to enable one set of wordline components to be distinguished relative to another set, and do not indicate any substantial structural difference between the wordline components. The even and odd wordline components alternate with one another across the memory array 304.

Source lines (SLm, SLm+1, etc.) are coupled with the memory cells MC, and bitlines (BLm, BLm+1, etc.) are coupled with the access transistors 74. The source lines and bitlines extend to sense circuitry, column decoder circuitry, and column driver circuitry (labeled as Sense CKT & Column Decoder/Driver).

Each of the memory cells MC is uniquely addressed through a combination comprising one of the source lines, one of the bitlines and one of the wordlines.

The access transistors 74 are arranged in rows (Rn, Rn+1, etc.) across the memory array 304, with each row being between one of the even wordline components and one of the odd wordline components. The access transistors comprise the semiconductor material pillars 280 (as shown in FIGS. 26 and 27), and accordingly the semiconductor material pillars 280 would also be arranged in the same rows as the access transistors 74.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming integrated circuitry. A structure is formed which has first conductive lines over a dielectric bonding region, has semiconductor material pillars extending upwardly from the first conductive lines, and has second conductive lines over the first conductive lines and extending along sidewalls of the semiconductor material pillars. The first conductive lines extend along a first direction, and the second conductive lines extend along a second direction which intersects the first direction. The semiconductor material pillars include a first semiconductor material. The structure includes a second semiconductor material under the dielectric bonding region. The first semiconductor material is monocrystalline silicon. Memory structures are formed over the semiconductor material pillars. The memory structures are within a memory array. Third conductive lines are formed over the memory structures. The third conductive lines extend along the first direction. Individual memory structures of the memory array are uniquely addressed through combinations of the first, second and third conductive lines.

Some embodiments include a method of forming integrated circuitry. A structure is formed which has first conductive lines over a dielectric bonding region, has semiconductor material walls over the first conductive lines, and has insulative walls between the semiconductor material walls. The first conductive lines, the insulative walls, and the semiconductor material walls all extend along a first direction. The insulative walls and the semiconductor material walls alternate with one another along a second direction which intersects the first direction. The semiconductor material walls comprise a first semiconductor material, and the insulative walls comprise insulative material. The structure comprises a second semiconductor material under the dielectric bonding region. The structure has a planarized surface extending across the semiconductor material walls and the insulative walls. Trenches are formed which extend downwardly into the semiconductor material walls and the insulative walls. The trenches extend along the second direction. The trenches form semiconductor material pillars from upper regions of the semiconductor material walls. The semiconductor material pillars are over lower regions of the semiconductor material walls. The lower regions are semiconductor material rails which extend along the first conductive lines. Sidewall edges of the semiconductor material pillars are exposed within the trenches, and top edges of the semiconductor material rails are exposed within the trenches. Dielectric material is formed along the exposed sidewall edges of the semiconductor material pillars and along the exposed top edges of the semiconductor material rails. Second conductive material is formed within the trenches and adjacent the dielectric material. The second conductive material is configured as second conductive lines which extend along the second direction. Memory structures are formed over the semiconductor material pillars.

Some embodiments include a method of forming integrated circuitry. A structure is formed to comprise first conductive lines over a dielectric bonding region. The first conductive lines extend along a first direction. The structure comprises conductive beams over the first conductive lines, and spaced from the first conductive lines by insulative regions. The conductive beams comprise conductive material and are configured as downwardly-opening container shapes. Each of the downwardly-opening container shapes includes a pair of sidewall regions, and includes a top region extending across the sidewall regions. The conductive beams are spaced from one another by semiconductor material walls. Gate dielectric material is between the semiconductor material walls and the conductive beams. The conductive beams and the semiconductor material walls extend along a second direction which intersects the first direction. The conductive beams and the semiconductor material walls alternate with one another along the first direction. The semiconductor material walls have bottom surfaces with first and second regions. The first regions are over top surfaces of the first conductive lines, and the second regions are between the first regions. The semiconductor material walls comprise a first semiconductor material. The structure comprises a second semiconductor material under the dielectric bonding region. Openings are formed to extend downwardly through the semiconductor material walls. The openings form semiconductor material pillars from the semiconductor material walls. The semiconductor material pillars comprise the first regions along the bottom surfaces of the semiconductor walls. The openings are filled with insulative material. The first semiconductor material, the conductive material and the insulative material are polished. The polishing removes the top regions of the conductive beams and thereby forms spaced-apart second conductive lines from the sidewall regions of the conductive beams. The polishing forms a planarized surface which extends across the second conductive lines, the semiconductor material pillars and the insulative material. Upper surfaces of the second conductive lines are recessed relative to the planarized surface. Memory structures are formed over the semiconductor material pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming integrated circuitry, comprising:
   forming a structure having first conductive lines extending along a first direction over a dielectric bonding region;
   forming pillars of semiconductor material extending upwardly from the first conductive lines;
   forming second conductive lines over the first conductive lines and extending along sidewalls of the pillars along a second direction;
   forming memory structures over the pillars; the memory structures being within a memory array;
   forming third conductive lines over the memory structures; the third conductive lines extending along the first direction; individual memory structures of the memory array being uniquely addressed through combinations including the first, second and third conductive lines;
   wherein the first conductive lines are incorporated into bitlines or source lines; the third conductive lines are incorporated into the other of bitlines and source lines; and the second conductive lines are incorporated into wordlines; and
   wherein the wordlines are coupled with first and second wordline driver circuitries; wherein the wordlines comprise a set of even wordlines and a set of odd wordlines, with the even and odd wordlines alternating with one another across the array; wherein the semiconductor material pillars are arranged in rows across the memory array, with each row being between one of the even wordlines and one of the odd wordlines; wherein the rows alternate between first rows and second rows; wherein the even and odd wordlines associated with each of the first rows extend to first common lines which extend to the first wordline driver circuitry; and wherein the even and odd wordlines associated with each of the second rows extend to second common lines which extend to the second wordline driver circuitry.

2. A method of forming integrated circuitry, comprising:
   forming a structure comprising first conductive lines over a dielectric bonding region; the first conductive lines extending along a first direction; the structure comprising conductive beams over the first conductive lines, and spaced from the first conductive lines by insulative regions; the conductive beams comprising conductive material and being configured as downwardly-opening container shapes; each of the downwardly-opening container shapes including a pair of sidewall regions, and including a top region extending across the sidewall regions; the conductive beams being spaced from one another by semiconductor material walls; gate dielectric material being between the semiconductor material walls and the conductive beams; the conductive beams and the semiconductor material walls extending along a second direction which intersects the first direction; the conductive beams and the semiconductor material walls alternating with one another along the first direction;
   forming openings extending downwardly through the semiconductor material walls; the openings forming semiconductor material pillars from the semiconductor material walls;
   filling the openings with insulative material;
   forming a planarized surface which extends across the second conductive lines, the semiconductor material pillars and the insulative material;

recessing upper surfaces of the second conductive lines relative to the planarized surface; and forming memory structures over the semiconductor material pillars.

3. The method of claim 2 wherein the dielectric bonding region comprises silicon dioxide.

4. The method of claim 2 wherein the semiconductor material comprises monocrystalline silicon.

5. The method of claim 2 further comprising forming third conductive lines over the memory structures.

6. The method of claim 5 wherein the third conductive lines extend along the first direction.

7. The method of claim 5 wherein the first conductive lines are bitlines, the third conductive lines are source lines, and the second conductive lines are wordlines.

8. The method of claim 5 wherein the first conductive lines are source lines, the third conductive lines are bitlines, and the second conductive lines are wordlines.

9. The method of claim 8 wherein the wordlines are coupled with first and second wordline driver circuitries.

10. The method of claim 8 wherein the memory structures are MRAM cells.

* * * * *